(12) United States Patent
Chandrashekar et al.

(10) Patent No.: US 12,448,686 B2
(45) Date of Patent: Oct. 21, 2025

(54) REDUCING LINE BENDING DURING METAL FILL PROCESS

(71) Applicant: Lam Research Corporation, Fremont, CA (US)

(72) Inventors: Anand Chandrashekar, Fremont, CA (US); Lei Guo, San Jose, CA (US); Gang L. Liu, Fremont, CA (US); Sanjay Gopinath, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 32 days.

(21) Appl. No.: 18/550,190

(22) PCT Filed: Mar. 7, 2022

(86) PCT No.: PCT/US2022/019195
§ 371 (c)(1),
(2) Date: Sep. 12, 2023

(87) PCT Pub. No.: WO2022/197481
PCT Pub. Date: Sep. 22, 2022

(65) Prior Publication Data
US 2024/0158913 A1 May 16, 2024

Related U.S. Application Data

(60) Provisional application No. 63/200,564, filed on Mar. 15, 2021.

(51) Int. Cl.
*C23C 16/455* (2006.01)
*C23C 16/06* (2006.01)

(52) U.S. Cl.
CPC ........ *C23C 16/45527* (2013.01); *C23C 16/06* (2013.01); *C23C 16/45553* (2013.01)

(58) Field of Classification Search
None
See application file for complete search history.

(56) References Cited

U.S. PATENT DOCUMENTS

| | | | |
|---|---|---|---|
| 5,804,249 | A | 9/1998 | Sukharev et al. |
| 6,037,252 | A | 3/2000 | Hillman et al. |
| 6,399,490 | B1 | 6/2002 | Jammy et al. |
| 8,614,106 | B2 | 12/2013 | Lavoie et al. |
| 10,573,522 | B2 | 2/2020 | Jandl et al. |

(Continued)

FOREIGN PATENT DOCUMENTS

| | | |
|---|---|---|
| JP | 2002544657 A | 12/2002 |
| KR | 20070035250 A | 3/2007 |

(Continued)

OTHER PUBLICATIONS

International Preliminary Report on Patentability dated Mar. 3, 2022, in Application No. PCT/US2020/070429.

(Continued)

*Primary Examiner* — Michael P. Rodriguez
(74) *Attorney, Agent, or Firm* — Weaver Austin Villeneuve & Sampson LLP

(57) ABSTRACT

Methods of mitigating line bending during feature fill include deposition of a nucleation layer having increased roughness. In some embodiments, the methods include depositing two or more metal nucleation layers.

21 Claims, 19 Drawing Sheets

(56) References Cited

U.S. PATENT DOCUMENTS

| | | |
|---|---|---|
| 12,173,399 B2 | 12/2024 | Chandrashekar et al. |
| 2007/0066060 A1 | 3/2007 | Wang |
| 2007/0080459 A1 | 4/2007 | Seok |
| 2008/0011228 A1 | 1/2008 | Inoue et al. |
| 2008/0280438 A1 | 11/2008 | Lai et al. |
| 2009/0277867 A1 | 11/2009 | Mayer et al. |
| 2009/0280649 A1 | 11/2009 | Mayer et al. |
| 2011/0221044 A1 | 9/2011 | Danek et al. |
| 2012/0107503 A1 | 5/2012 | Abelson et al. |
| 2012/0153381 A1 | 6/2012 | Song |
| 2012/0187305 A1 | 7/2012 | Elam et al. |
| 2014/0106083 A1 | 4/2014 | Wu et al. |
| 2014/0187038 A1 | 7/2014 | Collins et al. |
| 2014/0231896 A1 | 8/2014 | Matsumori et al. |
| 2014/0264932 A1 | 9/2014 | Ting et al. |
| 2015/0299886 A1 | 10/2015 | Doubina et al. |
| 2016/0172211 A1 | 6/2016 | Demos et al. |
| 2017/0125548 A1 | 5/2017 | Hung et al. |
| 2017/0194204 A1 | 7/2017 | Sowa |
| 2017/0229341 A1 | 8/2017 | Chang et al. |
| 2017/0365513 A1 | 12/2017 | Yang et al. |
| 2018/0053660 A1* | 2/2018 | Jandl ................ H01L 21/28568 |
| 2020/0303409 A1 | 9/2020 | Lim et al. |
| 2022/0349048 A1 | 11/2022 | Chandrashekar et al. |
| 2025/0066907 A1 | 2/2025 | Chandrashekar et al. |

FOREIGN PATENT DOCUMENTS

| | | |
|---|---|---|
| KR | 20120068401 A | 6/2012 |
| WO | WO-2015145750 A1 | 10/2015 |

OTHER PUBLICATIONS

International Preliminary Report on Patentability dated Sep. 28, 2023, in PCT Application No. PCT/US2022/019195.

International Search Report and Written Opinion dated Jun. 17, 2022, in PCT Application No. PCT/US2022/019195.

International Search Report and Written Opinion dated Nov. 30, 2020, in application No. PCT/US2020/070429.

Corrected Notice of Allowance dated Feb. 16, 2022, in U.S. Appl. No. 16/724,231.

Corrected Notice of Allowance dated May 11, 2022, in U.S. Appl. No. 16/724,231.

Final Office Action dated Jun. 10, 2019 issued in U.S. Appl. No. 15/673,320.

Final Office Action dated Mar. 29, 2021 issued in U.S. Appl. No. 16/724,231.

Final Office Action dated Oct. 23, 2023 in U.S. Appl. No. 17/634,067.

Non-Final Office Action dated Apr. 13, 2023 in U.S. Appl. No. 17/634,067.

Notice of Allowance dated Feb. 2, 2022 in U.S. Appl. No. 16/724,231.

Notice of Allowance dated Sep. 26, 2019 issued in U.S. Appl. No. 15/673,320.

Notice of allowance dated Sep. 29, 2021 issued in U.S. Appl. No. 16/724,231.

Office Action dated Dec. 21, 2018 issued in U.S. Appl. No. 15/673,320.

Office Action dated Sep. 22, 2020 issued in U.S. Appl. No. 16/724,231.

JP Office Action dated Jul. 9, 2024 in JP Application No. 2022-510890, with English Translation.

KR Office Action dated Dec. 9, 2024 in KR Application No. 10-2022-7009027, with English Translation.

SG Search Report and Written Opinion dated May 28, 2024 in SG Application No. 11202201606P.

Corrected Notice of Allowance dated Oct. 30, 2024 in U.S. Appl. No. 17/634,067.

Non-Final Office Action dated Mar. 14, 2024 in U.S. Appl. No. 17/634,067.

Notice of Allowance dated Aug. 7, 2024 in U.S. Appl. No. 17/634,067.

Notice of Allowance dated Sep. 16, 2024 in U.S. Appl. No. 17/634,067.

U.S. Appl. No. 18/940,814, inventors Chandrashekar A, et al., filed on Nov. 7, 2024.

JP Office Action dated Jan. 7, 2025 in JP Application No. 2022-510890, with English Translation.

* cited by examiner

FIG. 3A  FIG. 3B

Constrictions
351

REDUCING LINE BENDING DURING METAL FILL PROCESS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes

BACKGROUND

Deposition of conductive materials is an integral part of many semiconductor fabrication processes. These materials may be used for horizontal interconnects, vias between adjacent metal layers, contacts between metal layers and devices on the silicon substrate, and high aspect ratio features. In an example of a deposition process on a semiconductor substrate, the substrate is heated to a process temperature in a vacuum chamber and a very thin portion of film, which serves as a seed or nucleation layer, is deposited. Thereafter, the remainder of the film, referred to as the bulk layer, is deposited on the nucleation layer. The bulk layer is generally deposited more rapidly than the nucleation layer. However, as devices shrink and more complex patterning schemes are utilized in the industry, deposition of thin films to fill features becomes a challenge. One challenge The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods of mitigating line bending during feature fill are described. In some embodiments, the methods involve depositing a first nucleation layer that disrupts or prevents line bending caused by interatomic forces. In some embodiments, the first nucleation layer is deposited at conditions in which roughness is increased. In some embodiments, one or more additional nucleation layers are then deposited. The one or more additional nucleation layers may facilitate one or more of the following: decreasing resistivity, providing a barrier to unwanted species such as fluorine or other halogens, and providing a good template for subsequent bulk deposition. A bulk layer of metal may be deposited directly on the first nucleation layer or on the one or more additional nucleation layers.

One aspect of the disclosure relates to a method including providing a substrate having a plurality of features spaced apart, each feature having a feature opening width, wherein the width of the feature narrows from the top of the feature to the bottom of the feature; depositing a first conformal metal nucleation layer in the plurality of features; and depositing a second conformal metal nucleation layer on the first conformal metal nucleation layer, wherein one or more of the following is different during deposition of the first conformal metal nucleation layer than during deposition of the second conformal metal nucleation layer: a) reducing agent chemistry, b) metal precursor and reducing agent flow sequence, c) metal precursor and reducing agent flow duration, d) purge conditions, e) chamber pressure, and f) substrate temperature.

In some embodiments, the width of the bottom of each feature is between 0 nm and 90% of the width at the top of the feature. In some embodiments, the metal is selected from the group consisting of tungsten, ruthenium, molybdenum, and cobalt. In some embodiments, the first conformal metal nucleation layer is thicker than the second conformal metal nucleation layer.

In some embodiments, diborane is the reducing agent during deposition of the first metal nucleation layer and not during deposition of the second metal nucleation layer. In some embodiments, a metal precursor and a reducing agent are co-flowed during deposition of the first metal nucleation layer and wherein a metal precursor and a reducing agent are alternately pulsed during deposition of the second metal nucleation layer. In some embodiments, a pulse duration of the metal precursor is longer during deposition of the first metal nucleation layer than during deposition of the second metal nucleation layer. In some embodiments, a purge gas is continuously flowed during deposition of the first metal nucleation layer and pulsed during deposition of the second metal nucleation layer. In some such embodiments, pulsing the purge gas includes using one or more purge gas accumulators. In some embodiments, a chamber pressure housing the substrate is higher during deposition of the first metal nucleation layer than during deposition of the second metal nucleation layer. In some embodiments, a substrate temperature is higher during deposition of the first metal nucleation layer than during deposition of the second metal nucleation layer. In some embodiments, the features are spaced apart with a pitch of between about 10 nm and 60 nm between adjacent features. In some embodiments, the method further includes depositing a third conformal metal nucleation layer on the second conformal metal nucleation layer. In some embodiments, the first nucleation layer thickness is between about 1 nm to 2 nm. In some embodiments, the second nucleation layer thickness is between about 0.5 nm to 1 nm.

Another aspect of the disclosure relates to a method including: providing a substrate having a plurality of features spaced apart, each feature having a feature opening width, wherein the width of the feature narrows from the top of the feature to the bottom of the feature; and depositing a first conformal metal nucleation layer in the plurality of features under supersaturated conditions by exposing the feature to alternating doses of a reducing agent and a metal precursor, wherein each of the reducing agent doses is at least ¼ liter and at least 10 seconds in duration.

In some embodiments, the method includes depositing a second conformal nucleation layer on the first conformal nucleation layer. In some embodiments, the method including depositing bulk metal directly on the first conformal metal nucleation layer to fill the features with metal. In some embodiments, the method including exposing the first conformal nucleation layer to a nitrogen-containing inhibition chemistry to inhibit nucleation in the plurality of features. According to various embodiments, the nucleation may be inhibited throughout the plurality of features including at the bottom of the features or the nucleation may be inhibited preferentially at the top of the features.

These and other aspects of the disclosure are described further below with reference to the drawings.

DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with specific embodiments, it will be understood that it is not intended to limit the disclosed embodiments.

Metal fill of features is used in semiconductor device fabrication to form electrical contacts. There are various challenges in filling features with metal as devices scale to smaller technology nodes and more complex patterning structures are used. For metals that are deposited with a fluorine-containing reactant, one challenge is reducing the fluorine content in the deposited metal film. Tungsten (W) films, for example, may be deposited using tungsten hexafluoride ($WF_6$). Deposition of W in a feature using $WF_6$ can result in fluorine incorporation. As feature size decreases, fluorine incorporation can present a larger challenge. This is because the same fluorine concentration in a tungsten film will affects device performance more in small features than large features. One reason for this is that thinner films may be used in smaller features and fluorine diffusion is easier in thinner films.

Figure 1:
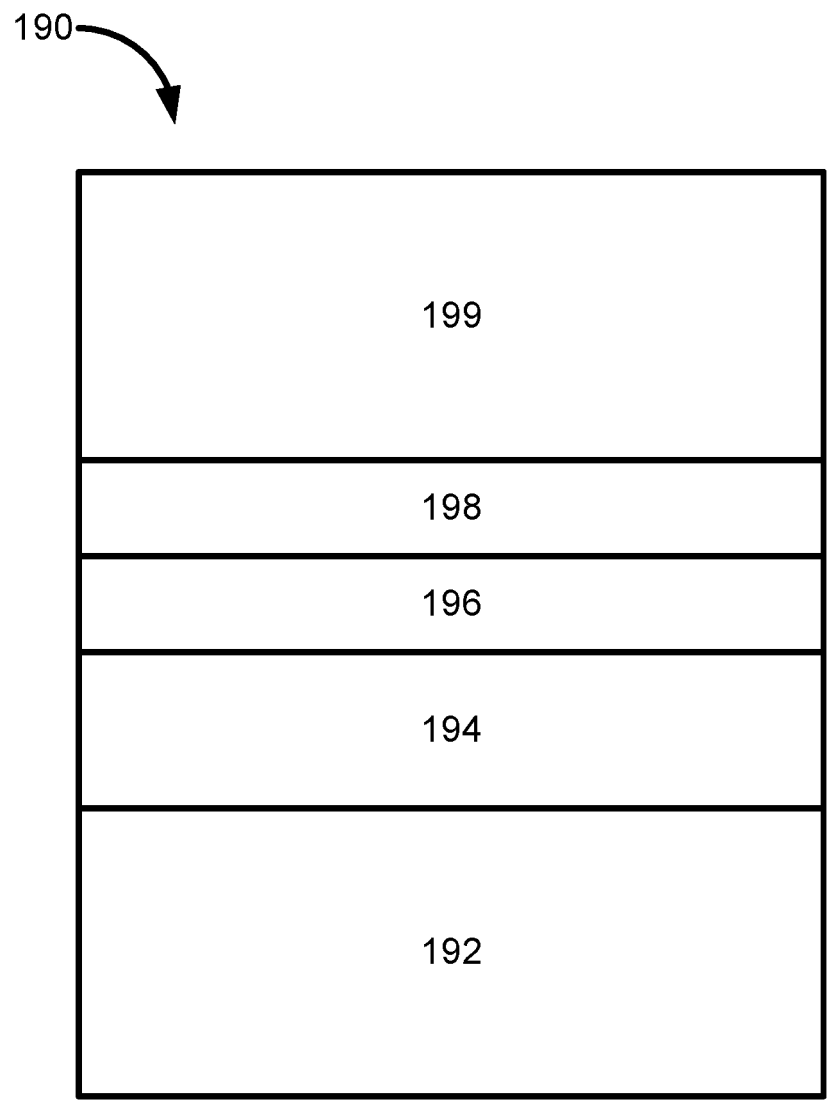
FIG. 1 shows an example stack of layers according to various embodiments.

A barrier layer may be deposited prior to depositing tungsten in a feature. The barrier layer prevents fluorine from diffusing from tungsten to underlying layers. This is illustrated in FIG. 1, which shows an example stack of layers 190. The layers include a silicon layer 192, an oxide layer 194, a barrier layer 196, a tungsten nucleation layer 198, and a bulk tungsten layer 199. Examples of oxide layers include titanium oxide ($TiO_x$), and silicon oxides such as tetraethyl orthosilicate (TEOS) oxide. The barrier layer 196 may be titanium nitride (TiN), for example. It prevents fluorine diffusion from the bulk tungsten layer 199 and the tungsten nucleation layer 198 to the oxide layer 194. However, as devices shrink, barrier layers become thinner, and fluorine may still diffuse from the deposited tungsten layers. Although chemical vapor deposition (CVD) of bulk tungsten performed at a higher temperature results in lower fluorine content, such films have poor step coverage. Fluorine incorporation may occur for any metal deposited using a fluorine-containing precursor, such as molybdenum deposited from molybdenum hexafluoride ($MoF_6$).

In addition to fluorine incorporation, another challenge in feature fill is reducing resistance. Low resistivity films minimize power losses and overheating in integrated circuit designs. Thinner films have higher resistance than thicker films. As features become smaller, the metal contact or line resistance increases due to scattering effects in the thinner films. Nucleation layers typically have higher electrical resistivities than the overlying bulk layers. Barrier layers may also have high resistivities. Further, thin barrier and nucleation films occupy a larger percentage of smaller features, increasing the overall resistance in the feature.

Yet another challenge in metal fill is reducing stress on deposited films. Thinner films tend to have increased tensile stress. High thermal tensile stress causes the substrate to curl, which makes subsequent processing difficult. For example, subsequent processes may include chemical mechanical planarization, deposition of materials, and/or clamping of the substrate to a substrate holder to perform processes in a chamber. However, these processes often rely on the substrate being flat, and a curled substrate results in non-uniform processing or inability to process the substrate.

Another challenge is reducing line bending. Line bending is a phenomenon resulting from filling multiple adjacent features. During the fill process, the features may bend away from or toward each other, changing the feature shape. Line bending in structures such as dynamic random-access memory (DRAM) buried wordline structures (bWL) during fill is believed to be caused by grain boundary merging. This is also referred to as a "zipping" mechanism. When the grain boundaries are formed, the metal-metal bonding between adjacent surfaces causes strain that leads to bending of the silicon fins (lines) separating the bWL. During a fill process, the metal-metal bonding from opposing sidewalls can lead to zipping. Atomic layer deposition (ALD) and chemical vapor deposition (CVD) fill techniques can result in severe bending of the bWL structures. This line bending can cause recess non-uniformity and contact landing issues in downstream processes, which results in DRAM yield loss.

ALD can be used to form exhibit low stress, low fluorine, and low resistivity films but only on surfaces that allow for such growth. As devices shrink and features are narrower, the potential for line bending during feature fill increases.

Figure 2A:
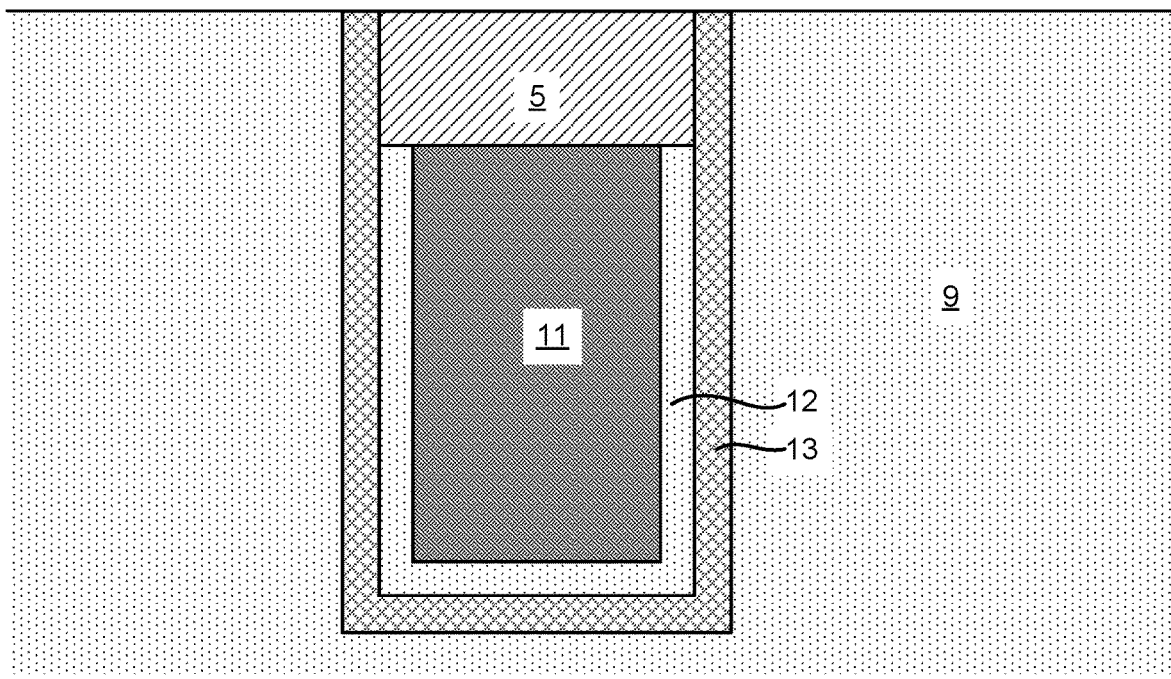
FIG. 2A-3I are schematic examples of various structures in which tungsten may be deposited according to various embodiments.

The methods and related apparatus described herein provide feature fill techniques that mitigate line bending, reduce fluorine incorporation, and lower resistivity. Particular embodiments relate to methods and related apparatus for formation of wordlines in memory devices. FIG. 2A depicts a schematic example of a DRAM architecture including a buried wordline (bWL) 11 in a silicon substrate 9. The bWL 11 is formed in a trench etched in the silicon substrate 9. The bWL 11 may be tungsten deposited in the silicon substrate 9 and is capped by SiN passivation layer 5. Lining the trench are a conformal barrier layer 12 and a conformal insulating layer 13. The conformal insulating layer 13 is between the conformal barrier layer 12 and the silicon substrate 9. In the example of FIG. 2A, the insulating layer 13 may be a gate oxide layer formed from a material such as a silicon oxide. Examples of conformal barrier layers include TiN and tungsten-containing barrier layers. Tungsten-containing conformal barrier layers can include binary compounds such as $WB_x$, $WSi_x$, $WGe_x$, $WC_x$, $WN_x$, ternary compounds such as $WB_xN_y$, $WSi_xN_y$, $WGe_xN_y$, $WSi_xC_y$, $WB_xC_y$, $WGe_xC_y$, $WC_xN_y$, and quaternary compounds such as $WB_xGe_yN_z$, $WGe_xC_yN_z$, etc. wherein x, y and z are numbers greater than zero.

Figure 2B:
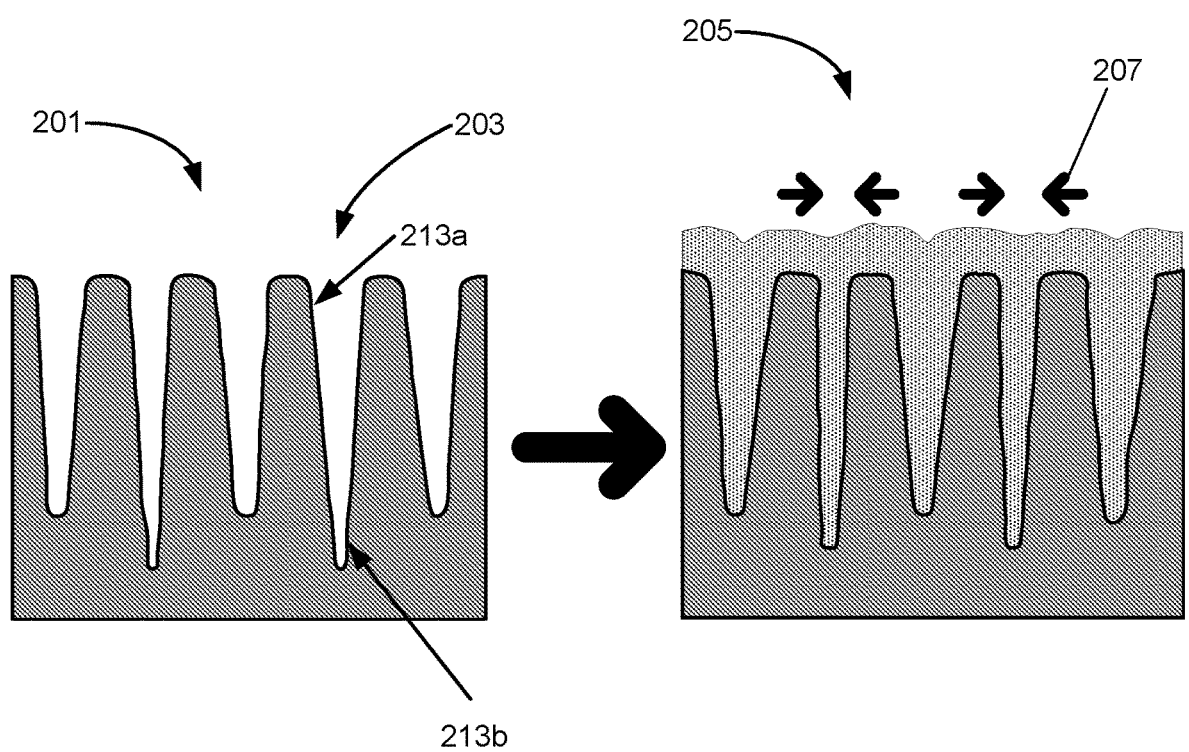
Figure 2C:
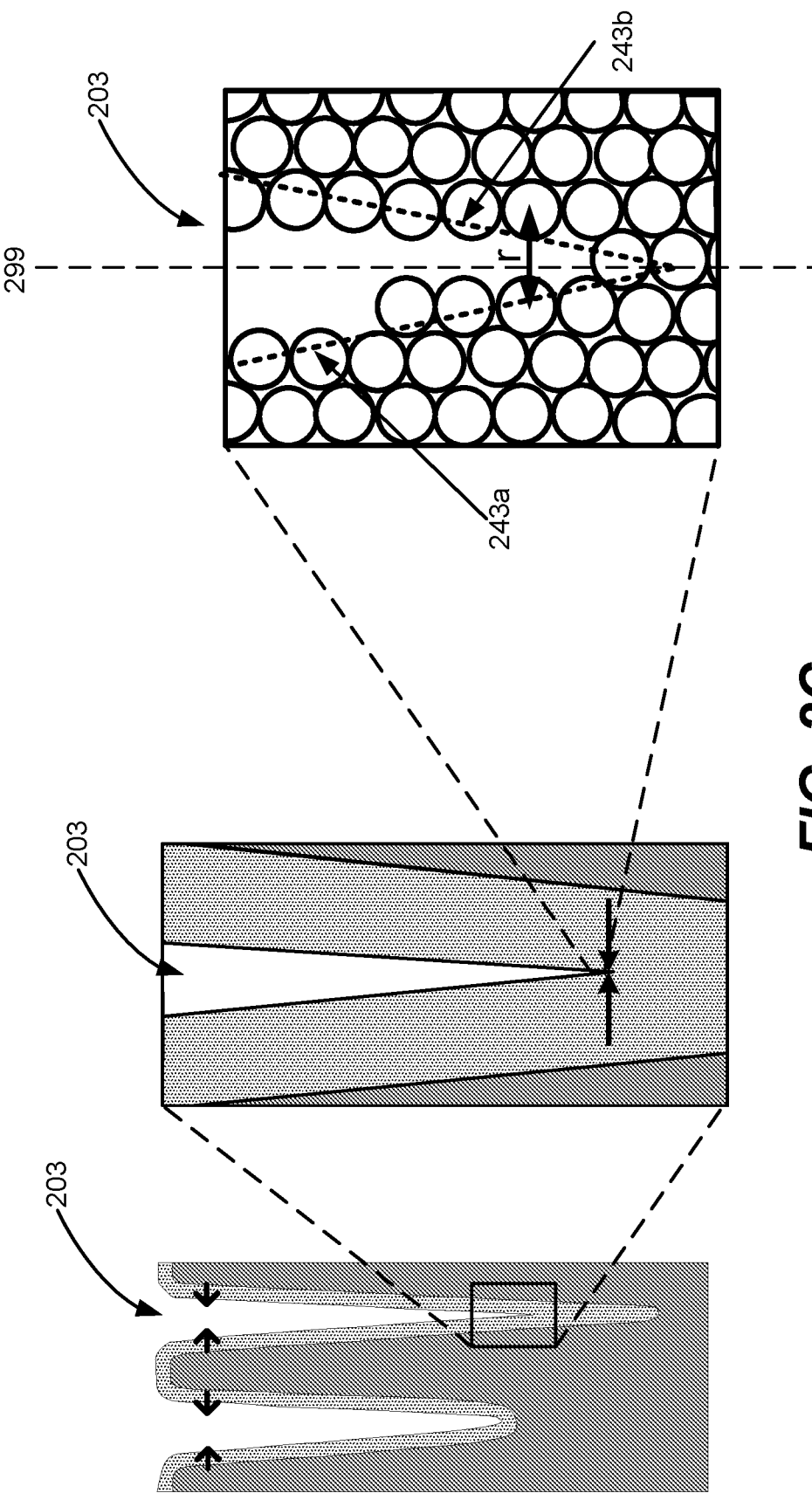
Figure 2D:
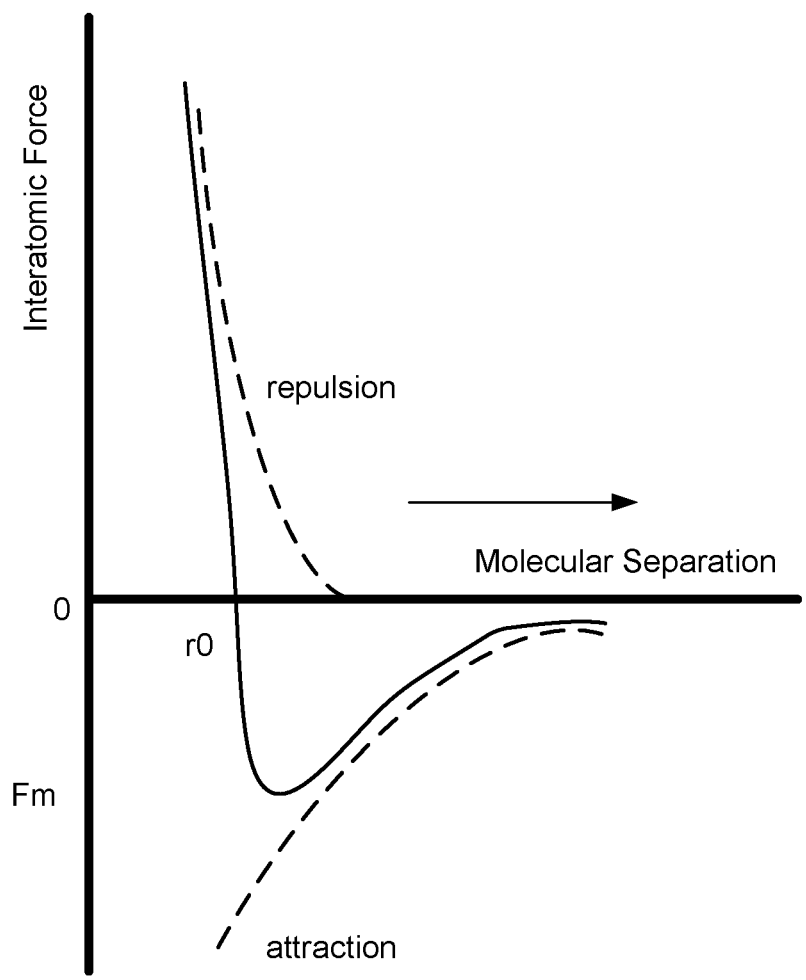

Fill processes for DRAM bWL trenches can distort the trenches such that the final trench width and resistance Rs are significantly non-uniform. FIG. 2B shows an unfilled (201) and filled (205) narrow asymmetric trench structure for DRAM bWLs that exhibit line bending after fill. As shown, multiple features are depicted on a substrate. These features are spaced apart, and in some embodiments, adjacent features have a pitch between about 5 nm and about 60 nm, or about 20 nm and about 60 nm, or between about 10 nm and 30 nm, or between about 10 nm and 40 nm, or between about 20 nm and 40 nm. The pitch is defined as the distance between the middle axis of one feature to the middle axis of an adjacent feature. The unfilled features may be generally V-shaped as shown in feature 203, having sloped sidewalls where the width of the feature narrows from the top of the feature to the bottom of the feature. The features widen from the feature bottom 213b to the feature top 213a. After fill, severe line bending is observed in substrate 205. Without being bound by a particular theory, it is believed that a cohesive force between opposing surfaces of a trench pulls the trench sides together as depicted by arrows 207. This phenomenon is illustrated in FIG. 2C. As described above, it may be characterized as zipping up the feature. As the feature 203 is filled, more force is exerted from a center axis 299 of the feature 203, causing line bending. Deposited tungsten 243a and 243b on sidewalls of feature 203 thereby interact in close proximity, where tungsten-tungsten bond radius r is small. This causes cohesive interatomic forces between the smooth growing surfaces of tungsten, pulling the sidewalls together. The result is line bending. FIG. 2D qualitatively illustrates the interatomic force as a function of tungsten-tungsten bond radius, r. As can be seen, a cohesive force exists at certain values of r. Even low stress tungsten films deposited by ALD processes can cause severe line bending during the fill. While V-shaped features are described herein, the methods may be applied advantageously with features of any profile that undergo line bending during feature fill.

Described herein are methods of filling features with metal and related systems and apparatuses to reduce line bending. Although various examples and embodiments herein are described with respect to tungsten, it will be understood that disclosed embodiments are suitable for depositing a variety of metals, including but not limited to ruthenium (Ru), molybdenum (Mo), cobalt (Co), and more. Examples of applications include logic and memory contact fill, DRAM buried wordline fill, vertically integrated memory gate/wordline fill, and 3-D integration with through-silicon vias (TSVs). The methods described herein can be used to fill vertical features, such as in tungsten vias, and horizontal features, such as 3D-NAND wordlines. The methods may be used for conformal and bottom-up or inside-out fill.

Methods described herein are performed on a substrate that may be housed in a chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Substrates have features such as via or contact holes, which may be characterized by one or more of V-shaped sidewalls, narrow and/or re-entrant openings, constrictions within the feature, and high aspect ratios. A feature may be formed in one or more of the above described layers. For example, the feature may be formed at least partially in a dielectric layer. In some embodiments, a feature may have an aspect ratio of at least about 2:1, at least about 4:1, at least about 6:1, at least about 10:1, or higher. One example of a feature is a hole or via in a semiconductor substrate or a layer on the substrate. Features may be spaced apart on the substrate by a pitch between adjacent features of about 5 nm to 60 nm.

Figure 3D:
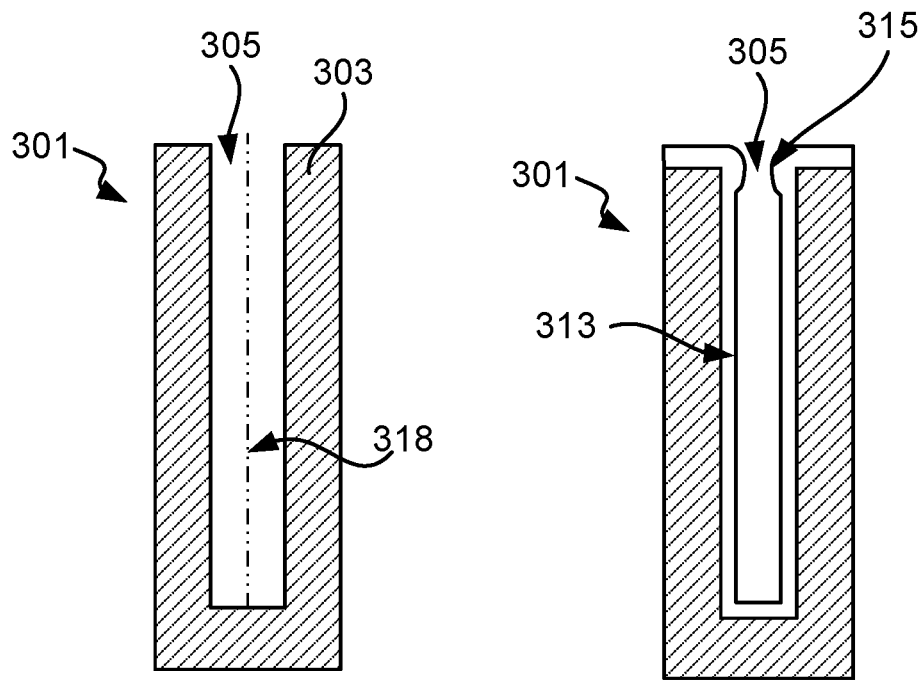
Figure 3D:
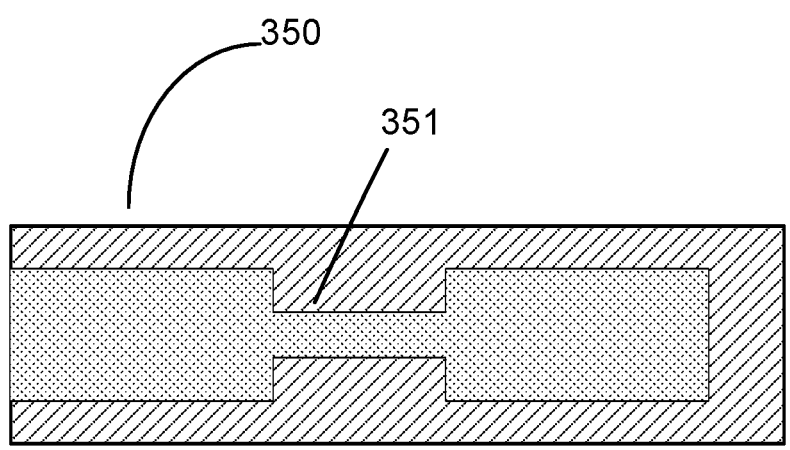

FIGS. 3A-3G are schematic examples of various structures in which tungsten may be deposited in accordance with disclosed embodiments. FIG. 3A shows an example of a cross-sectional depiction of a vertical feature 301 to be filled with tungsten. The feature 301 can include a feature hole 305 in a substrate 303. The hole 305 or other feature may have a dimension near the opening, e.g., an opening diameter or line width of between about 10 nm to 500 nm, for example between about 25 nm and about 300 nm. The feature hole 305 can be referred to as an unfilled feature or simply a feature. The feature 301, and any feature, may be characterized in part by an axis 318 that extends through the length of the feature through the center of the hole 305, with vertically-oriented features having vertical axes and horizontally-oriented features having horizontal axes.

In some embodiments, features are trenches in a 3D NAND structure. For example, a substrate may include a wordline structure having at least 60 lines, with 18 to 48 layers, or hundreds of layers, with trenches at least 200 Å deep or many microns deep. Another example is a trench in a substrate or layer. Features may be of any depth. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

FIG. 3B shows an example of a feature 301 that has a re-entrant profile. A re-entrant profile is a profile that narrows from a bottom, closed end, or interior of the feature to the feature opening. According to various implementations, the profile may narrow gradually and/or include an overhang at the feature opening. FIG. 3B shows an example of the latter, with an under-layer 313 lining the sidewall or interior surfaces of the feature hole 305 of feature 301. The under-layer 313 can be for example, a diffusion barrier layer, an adhesion layer, a nucleation layer, a combination of thereof, or any other applicable material. Non-limiting examples of under-layers can include dielectric layers and conducting layers, e.g., silicon oxides, silicon nitrides, silicon carbides, metal oxides, metal nitrides, metal carbides, and metal layers. In particular implementations, an under-layer can be one or more of titanium (Ti), titanium nitride (TiN), tungsten nitride (WN), titanium aluminide (TiAl), and tungsten (W). The under-layer 313 forms an overhang 315 such that the under-layer 313 is thicker near the opening of the feature 301 than inside the feature 301. In the examples of FIGS. 3A and 3B, features having vertical sidewalls are shown. However, as indicated above, in some embodiments, the feature width may narrow from top to bottom.

Figure 3C:
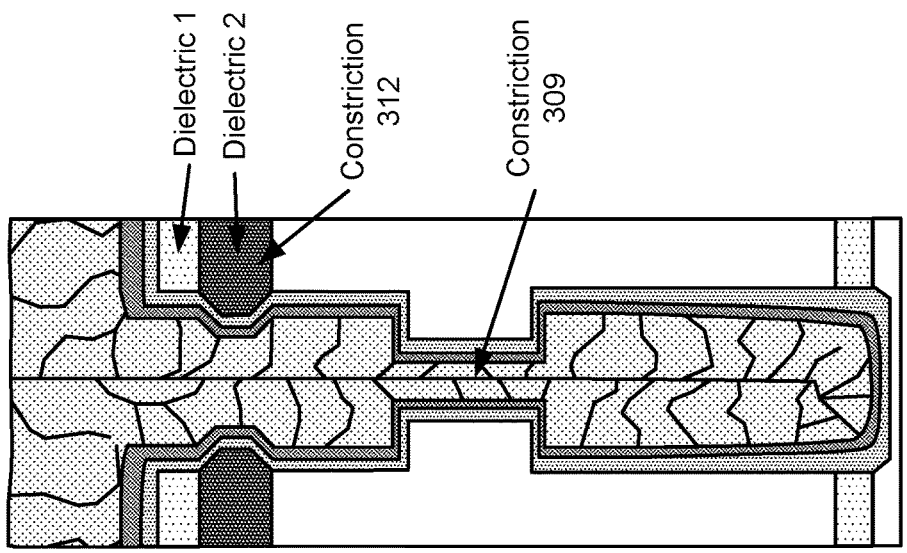
Figure 3C:
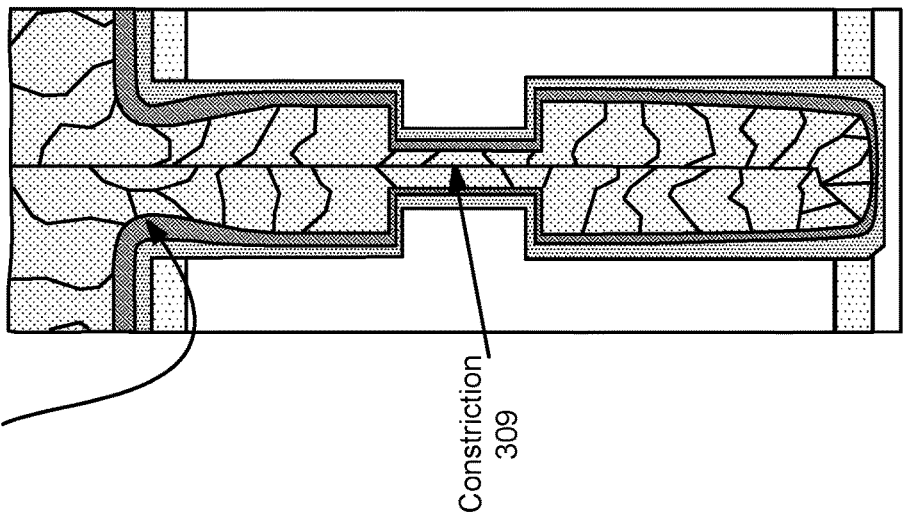
Figure 3C:
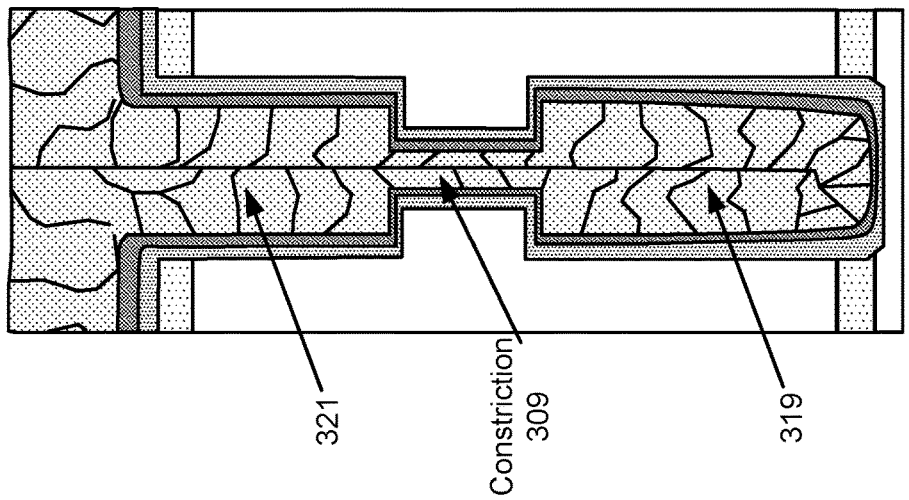

In some implementations, features having one or more constrictions within the feature may be filled. FIG. 3C shows examples of views of various filled features having constrictions. Each of the examples (a), (b) and (c) in FIG. 3C includes a constriction 309 at a midpoint within the feature. The constriction 309 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 315 at the feature opening. Such an overhang could also be a potential pinch-off point. Example (c) includes a constriction 312 further away from the field region than the overhang 315 in example (b). A feature having a constriction may narrow from top to bottom in some embodiments.

Horizontal features, such as in 3-D memory structures, can also be filled. FIG. 3D shows an example of a horizontal feature 350 that includes a constriction 351. For example, horizontal feature 350 may be a word line in a 3D NAND structure.

Figure 3E:
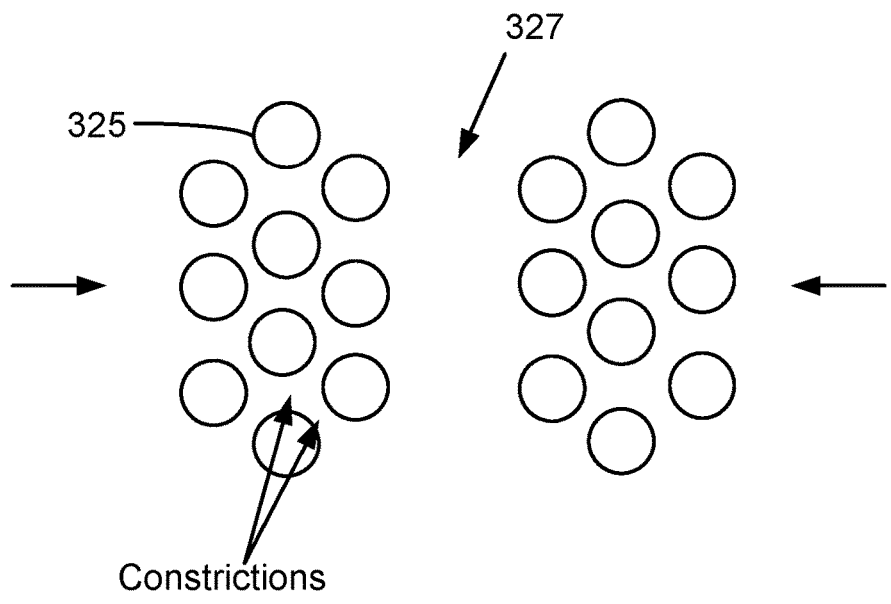
Figure 3F:
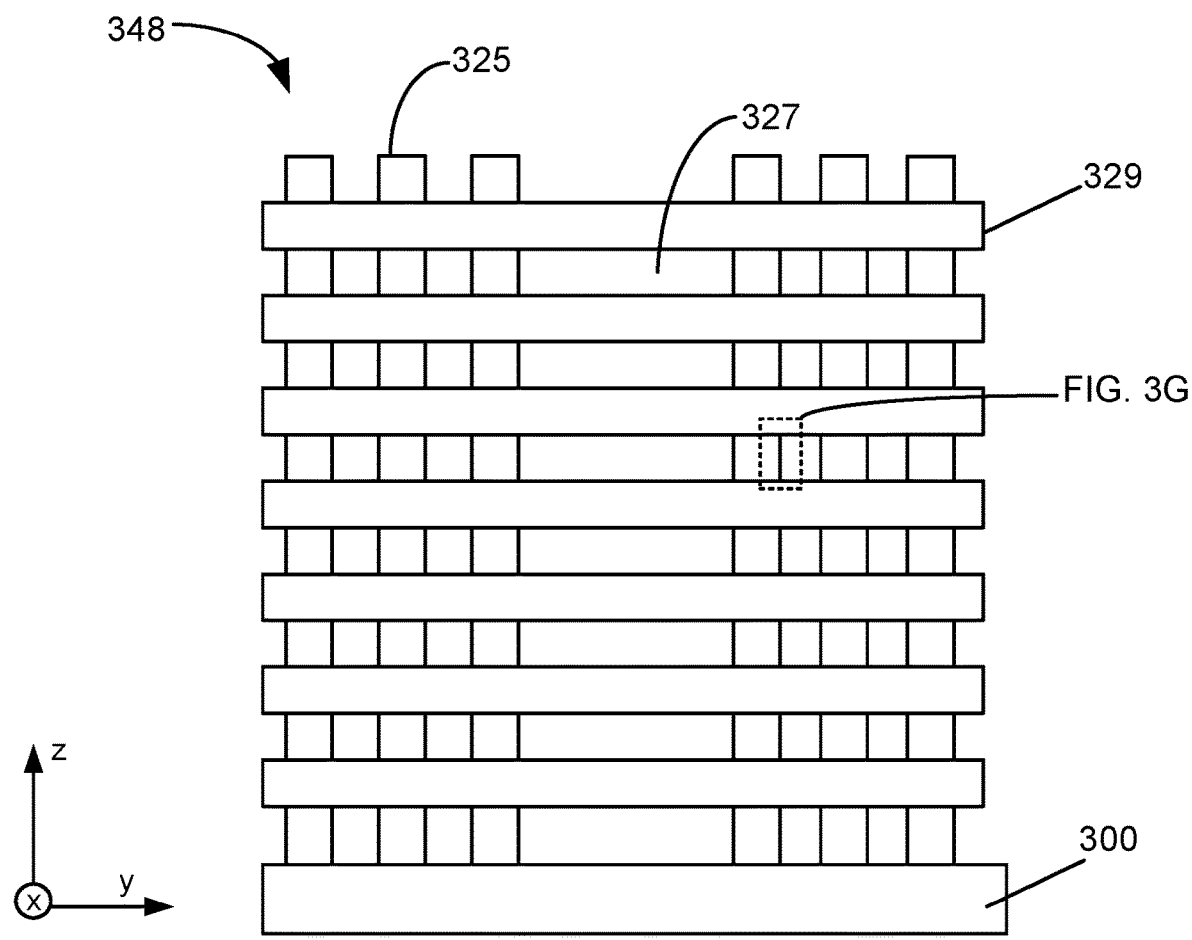

In some implementations, the constrictions can be due to the presence of pillars in a 3D NAND or other structure. FIG. 3E, for example, shows a plan view of pillars 325 in a 3D NAND or vertically integrated memory (VIM) structure 348, with FIG. 3F showing a simplified schematic of a cross-sectional depiction of the pillars 325. Arrows in FIG. 3E represent deposition material. Because pillars 325 are disposed between an area 327 and a gas inlet or other deposition source, adjacent pillars can result in constrictions 351 that present challenges in void free fill of an area 327.

The structure 348 can be formed, for example, by depositing a stack of alternating interlayer dielectric layers 329 and sacrificial layers (not shown) on a substrate 300 and selectively etching the sacrificial layers. The interlayer dielectric layers may be, for example, silicon oxide and/or silicon nitride layers, with the sacrificial layers a material selectively etchable with an etchant. This may be followed by etching and deposition processes to form pillars 325, which can include channel regions of the completed memory device.

The main surface of substrate 300 can extend in the x and y directions, with pillars 325 oriented in the z-direction. In the example of FIGS. 3E and 3F, pillars 325 are arranged in an offset fashion, such that pillars 325 that are immediately adjacent in the x-direction are offset with each other in the y-direction and vice versa. According to various implementations, the pillars (and corresponding constrictions formed by adjacent pillars) may be arranged in any number of manners. Moreover, the pillars 325 may be any shape including circular, square, etc. Pillars 325 can include an annular semi-conducting material, or circular (or square) semi-conducting material. A gate dielectric may surround the semi-conducting material. The area between each interlayer dielectric layer 329 can be filled with tungsten; thus structure 348 has a plurality of stacked horizontally-oriented features that extend in the x and/or y directions to be filled.

Figure 3G:
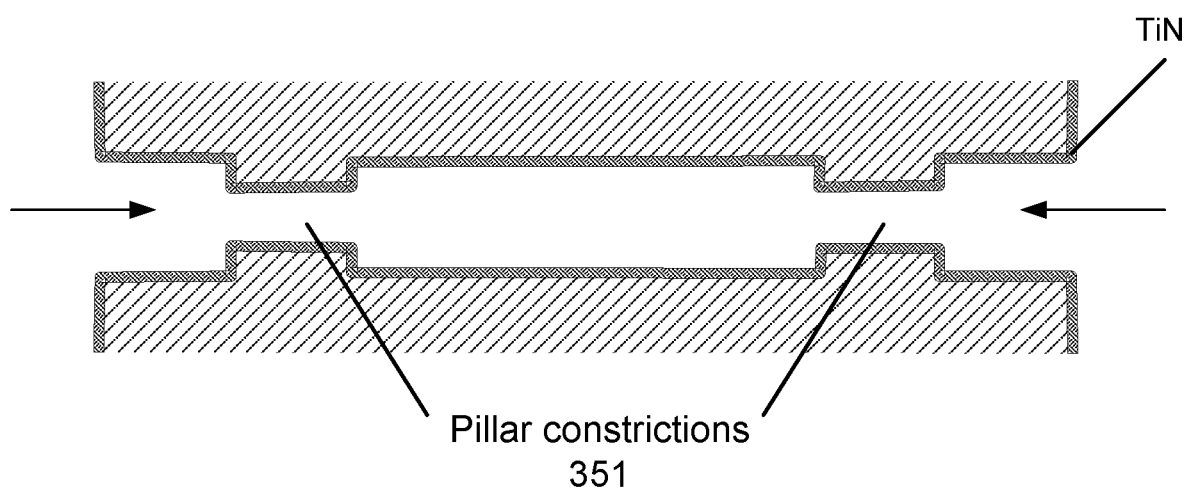

FIG. 3G provides another example of a view of a horizontal feature, for example, of a 3D NAND or other structure including pillar constrictions 351. The example in FIG. 3G is open-ended, with material to be deposited able to enter horizontally from two sides as indicated by the arrows. (It should be noted that example in FIG. 3G can be seen as a 2-D rendering 3-D features of the structure. FIG. 3G is a cross-sectional depiction of an area to be filled and pillar constrictions shown in the figure representing constrictions that would be seen in a plan rather than cross-sectional view.) In some implementations, 3-D structures can be characterized with the area to be filled extending along two or three dimensions (e.g., in the x and y or x, y and z-directions in the example of FIG. 3F), and can present more challenges for fill than filling holes or trenches that extend along one or two dimensions. For example, controlling fill of a 3-D structure can be challenging as deposition gasses may enter a feature from multiple dimensions.

Figure 3I:
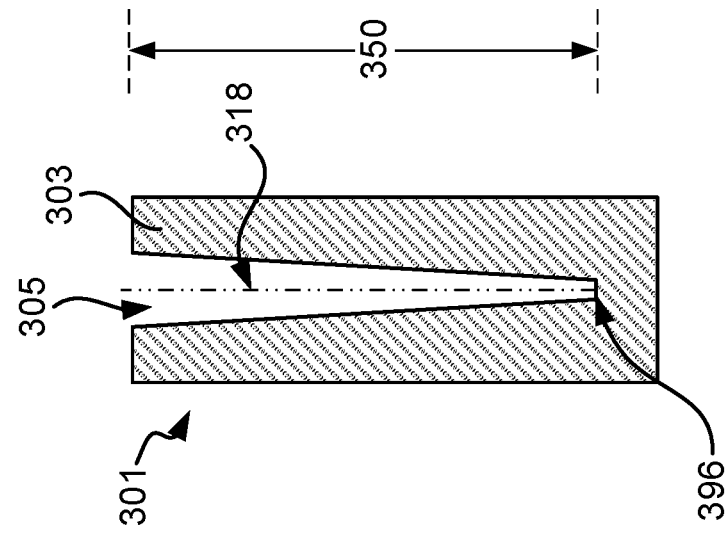
Figure 3H:
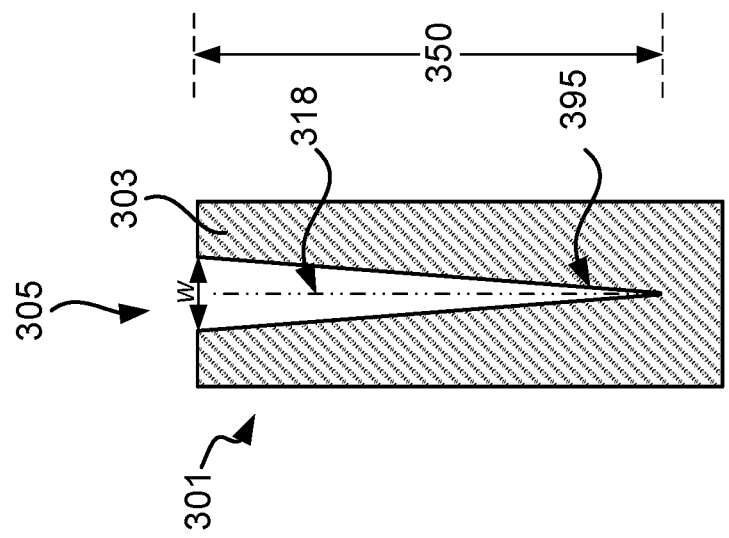

FIG. 3H provides an example of a cross-sectional view of a V-shaped feature. FIG. 3H includes feature 301 to be filled with tungsten, including a feature hole 305 in a substrate 303. The hole has a dimension near the opening (e.g., an opening diameter or a line width w, which may be between about 10 nm and about 20 nm, or about 15 nm). The width is measured by the distance between sidewalls of a feature. The width may vary from the top of the feature at the feature opening (the opening diameter or line width w) to the bottom of the feature. The feature hole 305 is characterized in part by an axis 318. The V-shaped feature 301 includes a depth 350 which may be between about 80 nm and about 120 nm, or about 100 nm. In various embodiments, the sidewalls meet at a point 395 at the bottom of the feature or in some embodiments, the bottom of the feature plateaus to a flat bottom surface, which may have a distance from one sidewall to the other of between about 0.1 w and about 0.9 w, or as a percentage of line width w at the opening of about 10% of the width w to about 90% of the width w. Other profiles in which the feature narrows from an opening to a closed end may benefit from the methods described herein, e.g., the closed end may have a curved surface. Still further, features having constrictions at a midpoint of the feature may also benefit from the methods described herein.

Features may have an aspect ratio of between 2:1 and about 10:1, or between about 6:1 and about 8:1, or about 6:1, or about 8:1. The pitch of the lines may be between about 5 nm and about 60 nm, or 20 nm and 60 nm, or between 10 nm and 30 nm, or between. The bottom of the feature, which is characterized as the region in the bottom 50% to 70% of the depth of the feature, may have a width between sidewalls of between 0 nm and about 20 nm.

FIG. 3I provides another example of a cross-sectional view of a V-shaped feature. A V-shaped feature as described herein refers to any feature having narrowing width from the top field level of the substrate to the bottom of the feature. The bottom may be flat, curved, or a point. In the case of a horizontal feature, the feature narrows from the opening to an interior position.)

FIG. 3I includes feature 301 to be filled with a metal such as tungsten, including a feature hole 305 in a substrate 303. The hole has a dimension w near the opening (e.g., an opening diameter or a line width), which may be between about 10 nm and about 20 nm, or about 15 nm. The bottom of the feature 396 has a width narrower than that of w. For example, the bottom of the feature 396 may have a width between 1% and 90% of the width w, or between 1% and 50%, or between 10% and 20% of the width w. While the sidewalls are depicted as straight in the examples of FIGS. 3H and I, it will be appreciated that the sidewalls may have roughness and/or be less than perfectly straight.

Multiple V-shaped features are present on a substrate in various disclosed embodiments, such as shown in FIG. 2B. Multiple features on a substrate are defined as adjacent features having a distance no larger than between 5 nm and 60 nm of each other. In various embodiments, such multiple features may be all V-shaped features, which may have a shape such as depicted in FIG. 3H or 3I.

Examples of feature fill for horizontally-oriented and vertically-oriented features are described below. It should be noted that the examples are applicable to both horizontally-oriented and vertically-oriented features. Moreover, it should also be noted that in the description below, the term "lateral" may be used to refer to a direction generally orthogonal to the feature axis and the term "vertical" to refer to a direction generally along the feature axis.

Disclosed embodiments are suitable for reducing line bending. Line bending analysis may be performed by measuring the line width and roughness of the trenches filled with tungsten or other metal. The line bending analysis involves imaging the metal at the top of the device opening with plan-view microscopy and measuring the metal width at multiple points on multiple lines. For each line, the line width is measured across 100 points. From each line, one then calculates the average line width and the variation of the line width, which may also be defined as roughness. The "line width mean" is the average of all the individual lines' average line width measured during analysis.

For line bending, two main metrics are defined as follows: (i) line-to-line (LTL) variation is the standard deviation of the average line widths, thereby capturing the variation of line width changes across different lines on the image, and (ii) line width roughness (LWR) is the average of line roughness (variation of line width within each line) from all the measured lines, thereby capturing the average line width variation within single lines. These two metrics, LTL and LWR are combined into single variation metric, σ total, as determined by $\sigma=(\sigma=(\sigma_1^2+\sigma_2^2)^{1/2}$. Furthermore, LTL and σ total are normalized with respect to line width mean, described as LTL % and σ total %.

In various embodiments, the methods result in substrates where total variance is less than about 5 nm, or less than about 1.5 nm, or in percentage, less than about 7.2%, where total variance percentage is calculated by normalizing total variance by the average line width.

While the description below focuses on tungsten feature fill, aspects of the disclosure may also be implemented in filling features with other materials. For example, feature fill using one or more techniques described herein may be used to fill features with other materials, including Mo, Co, and Ru. Further, it can be used to fill features with any material that undergoes grain growth in vapor deposition processes.

According to various embodiments, a first nucleation layer is deposited. The first nucleation layer disrupts or prevents the zipping mechanism described above. This can mitigate stress propagation towards dielectric in the feature and reduce or prevent line bending. The first nucleation layer may be deposited to at least a thickness to prevent the zipping mechanism described above. In some embodiments, the first nucleation layer is deposited at conditions in which roughness is increased.

In some embodiments, one or more additional nucleation layers are then deposited. The one or more additional nucleation layers may facilitate one or more of: decreasing resistivity, improving barrier properties, and providing a good template for subsequent bulk deposition. In some embodiments, bulk metal may be deposited directly on the first nucleation layer with deposition of one or more additional nucleation layers.

Figure 4:
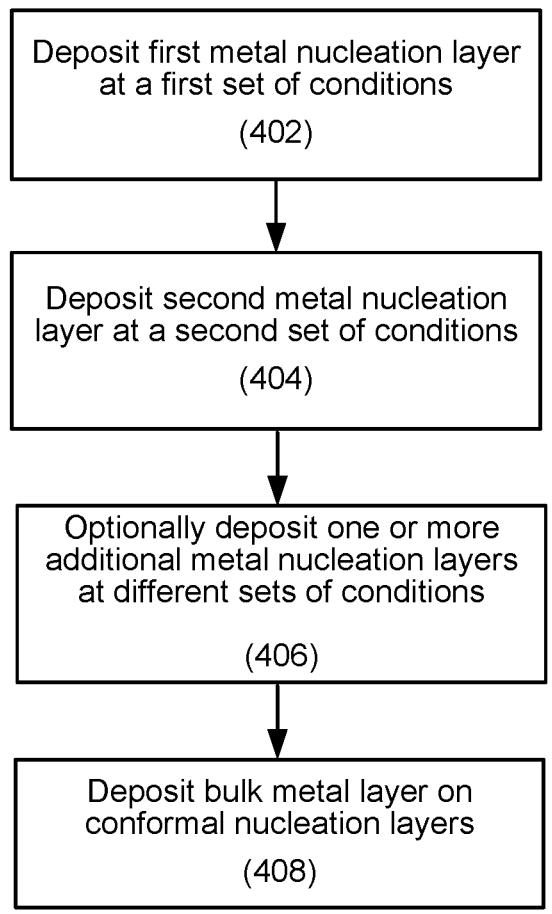
FIG. 4 shows provides an example of a process flow for filling a structure with no or significantly reduced line bending according to various embodiments.

FIG. 4 shows provides an example of a process flow for filling a structure with no or significantly reduced line bending. The process begins with depositing a first nucleation layer at a first set of conditions (402). The first nucleation layer is generally conformal to the structure and is deposited by reacting a metal precursor with a reducing agent. The first set of conditions are chosen to prevent line bending, with parameters including reducing agent chemistry, metal precursor and reducing agent flow sequence, metal precursor and reducing agent flow duration, purge conditions, pressure, and temperature. The manner in which of these affects line bending is discussed further below. In some embodiments, the first nucleation layer may be deposited from about 1 nm to 2 nm (or about 10-20 Angstroms, e.g., 8-22 Angstroms) in thickness, though the minimum thickness may be vary depending on the feature size and the inter-atomic forces of the material being deposited.

The process continues with depositing a second nucleation layer at a second set of conditions (404). The second nucleation layer is deposited directly on the first nucleation layer and is generally conformal to the structure. It is also deposited by reacting a metal precursor with a reducing agent but at a different set of conditions than the first nucleation layer. In some embodiments, the second nucleation layer may be deposited at slower deposition rate than the first nucleation layer and/or may be thinner than the first nucleation layer. In some embodiments, the second nucleation layer may be deposited from at least about 0.5 nm to 1 nm (e.g., about 4-12 Angstroms). Further discussion of the conditions used to deposit the second nucleation layer is provided below.

After deposition of the second nucleation layer, one or more additional nucleation layers may be deposited at different sets of conditions (406). The one or more additional nucleation layers may be deposited to tailor feature fill and subsequent deposition. In some embodiments, the total thickness of second and subsequent nucleation layers is between 0.5 nm to 1 nm (e.g., about 4-12 Angstroms).

In addition to preventing zipping, resistivity reduction, and barrier properties, the first, second, and if deposited, third and subsequent nucleation layers may be deposited under conditions to control one or more characteristics such as the incorporation of species such as boron and the growth characteristics of the subsequently deposited bulk film. For example, in the deposition of tungsten, a nucleation layer may be deposited that suppresses growth of beta-tungsten ((β-W). Beta-tungsten has a metastable A15 crystalline structure and exhibits higher resistivity than the stable body-centered cubic crystalline structure of alpha-tungsten. Nucleation layers deposited with boron-containing reducing agents may lead to the presence of higher resistivity beta-tungsten in bulk tungsten films at certain thicknesses.

At an operation 408, a bulk metal layer is deposited on the conformal nucleation layers, or more particularly, on the uppermost conformal nucleation layer. The bulk layer may be deposited by CVD or ALD. In many embodiments, a bulk layer is deposited to fill the trenches or other features of the structure with the method in FIG. 4 performed once. However, in some embodiments, operations 402-408 may be repeated one or more times to complete fill of one or more features. In some embodiments, the first nucleation layer may be sufficiently thick and operations 405 and 406 may be omitted.

Figure 5A:
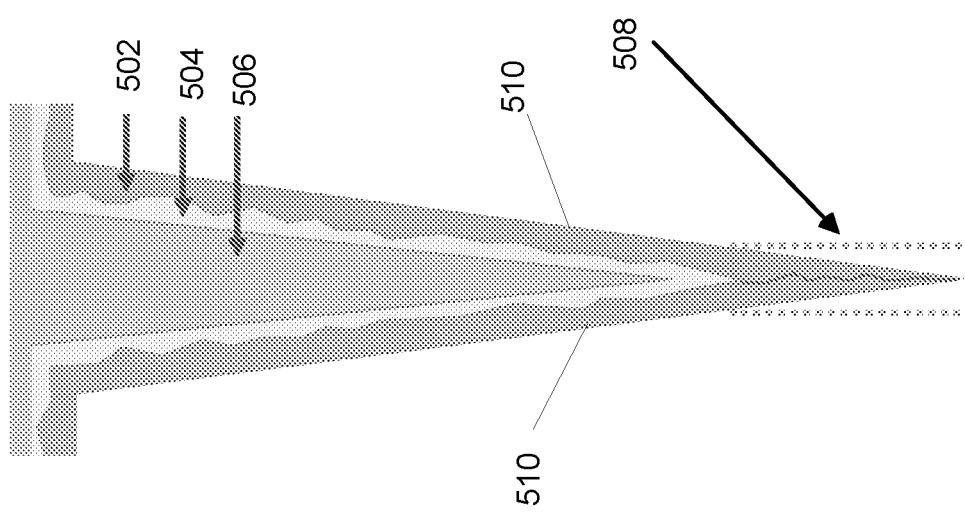
FIGS. 5A and 5B show a schematic example of feature filled using the method of FIG. 4 according to various embodiments.
Figure 5B:
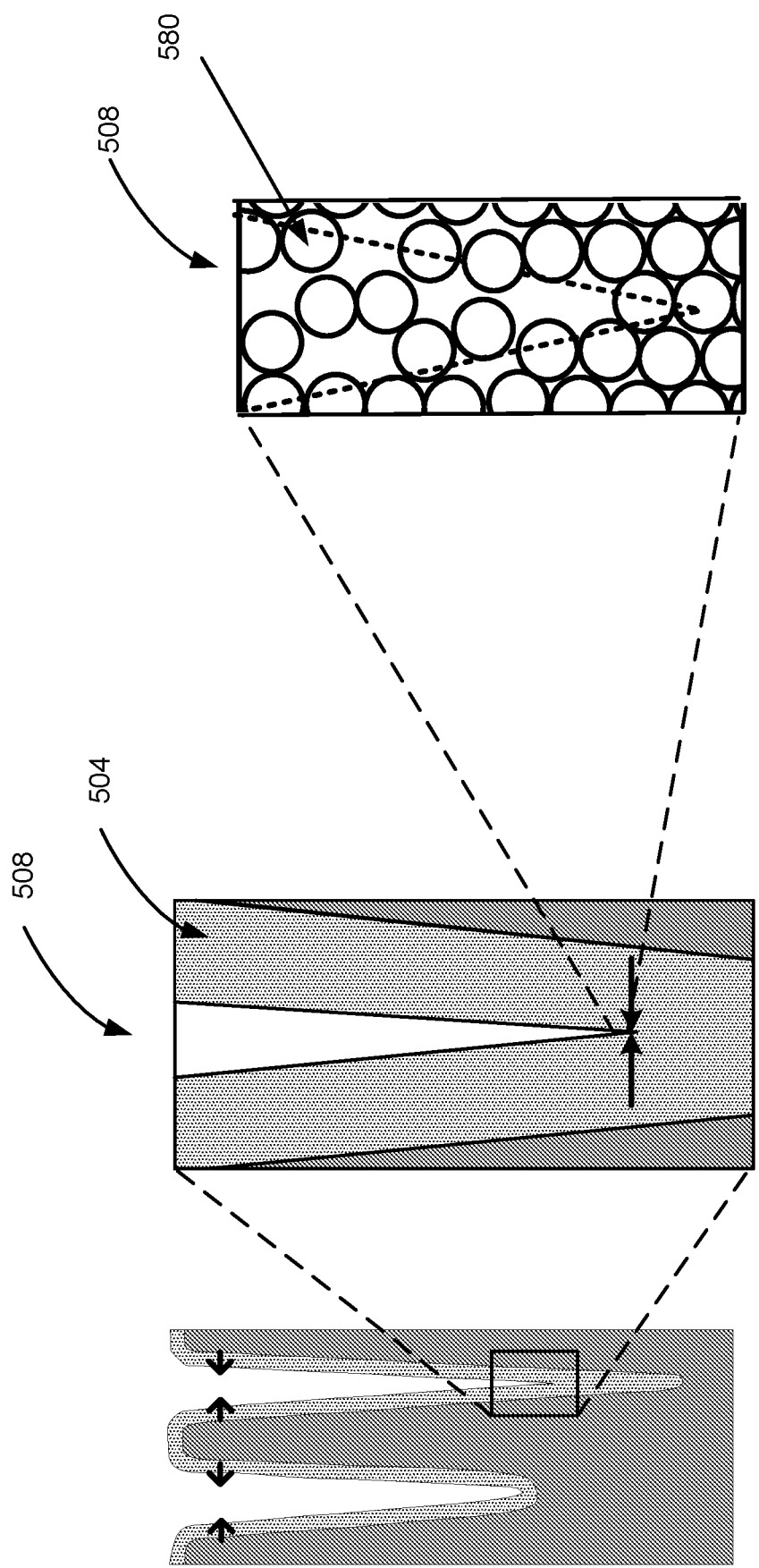

FIG. 5A shows a schematic example of feature filled using the method of FIG. 4. The filled feature includes a first nucleation layer 502, a second nucleation layer 504, and a bulk layer 506. The first nucleation layer 502 has increased roughness. (In FIG. 5A, the roughness is exaggerated for purposes of illustration.) It is deposited to a thickness to fill a bottom region 508 of the feature 500 that is susceptible to zipping due to the closeness of the sidewalls as they meet at the feature bottom. An example of a bottom region 508 is shown in FIG. 5B. Atoms 580 in the enlarged view have increased roughness. As can be seen by comparison to feature in FIG. 2C, the increased roughness of the first nucleation layer 504 reduces metal-metal bonding and prevents zipping.

Returning to FIG. 5A, above the bottom region 508, the sidewalls 510 are sufficiently far apart that subsequent deposition is not as susceptible to zipping. The second nucleation layer 504 is deposited, followed by a bulk layer 506.

As indicated above, the first nucleation layer is deposited using conditions that mitigate line bending, with parameters including a) reducing agent chemistry, b) metal precursor and reducing agent flow sequence, c) metal precursor and reducing agent flow duration, d) purge conditions, e) pressure, and f) temperature. Each of these is discussed below. Deposition of the first nucleation layer involves using one or more of these parameters in a manner that mitigates line bending.

a) Reducing agent chemistry: The nucleation layer may be deposited using a metal-containing precursor and a reducing agent. An example of a metal-containing precursor for tungsten deposition is tungsten hexafluoride ($WF_6$), which may be reduced to tungsten (W) metal by reaction with reducing agents such as silane ($SiH_4$) and diborane ($B_2H_6$). Examples of additional reducing agents and metal precursors are provided below. For deposition of a first nucleation layer, using a boron-containing reducing agent such as diborane tends to increase roughness and may be used in some embodiments for the first nucleation layer. In some embodiments, the reducing agent may be changed during deposition of the second and subsequent nucleation layers.

Figure 6:
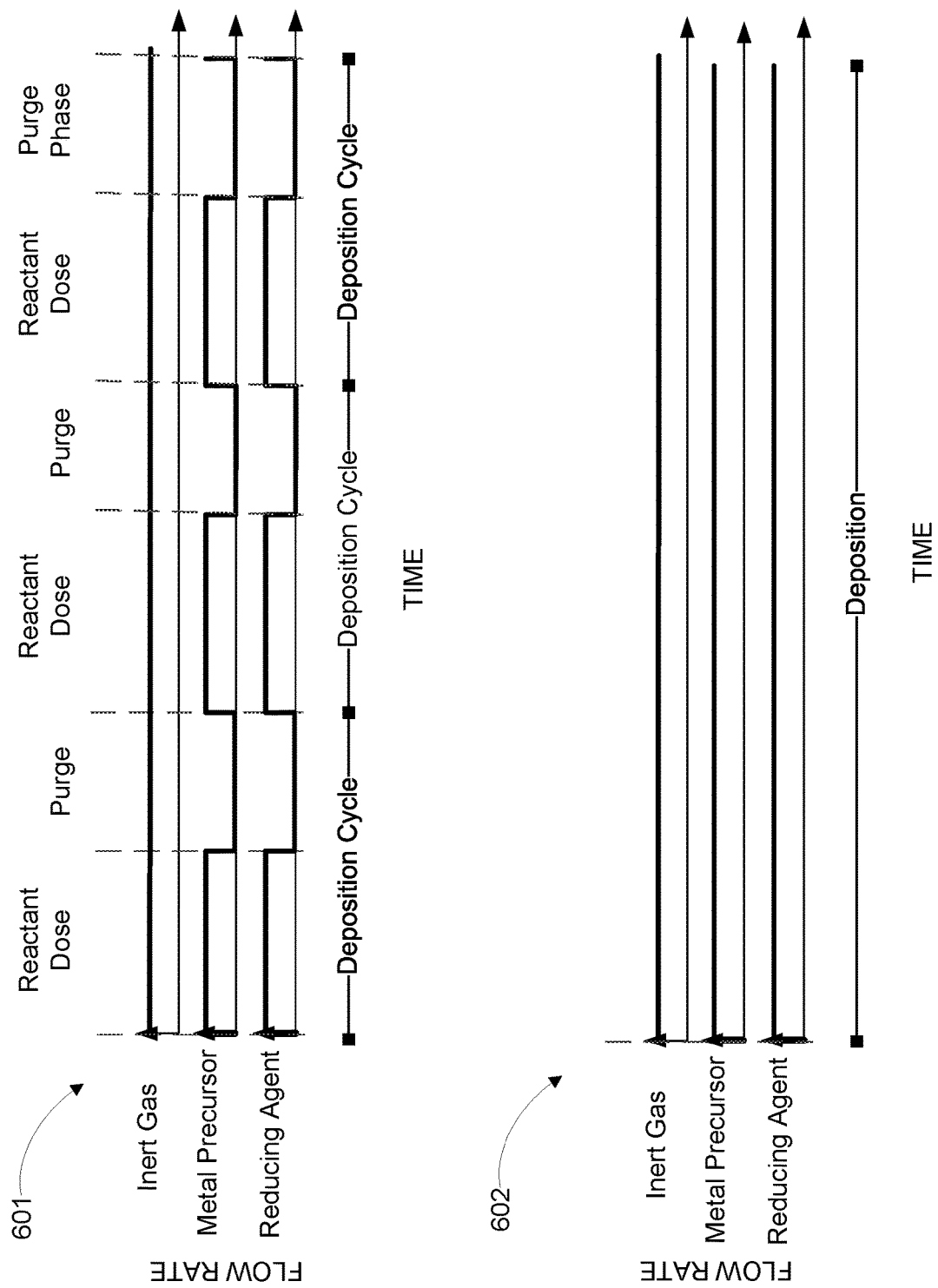
FIGS. 6 and 7 provide example flow sequences of reducing agent and metal co-reactant during deposition of a nucleation layer according to various embodiments.

In some embodiments, the metal precursor may be changed for deposition on the second nucleation layer.

b) Metal precursor and reducing agent flow sequence: The metal precursor and reducing agent may be delivered in alternating pulses or co-flowed. Example sequences are presented in FIGS. 6 and 7. In FIG. 6, two co-flow sequences are presented. First, at 601, is a sequence in which the metal precursor and reducing agent are co-flowed in pulses. Three deposition cycles, each having a reactant dose and a purge are shown. During the reactant doses, the metal precursor and reducing agent are co-flowed into the chamber. An inert gas flows throughout the process in this example. At 602, another sequence is shown in which the metal precursor and reactant dose are co-flowed continuously for the deposition without pulsing. An inert gas is flowed throughout the deposition.

Figure 7:
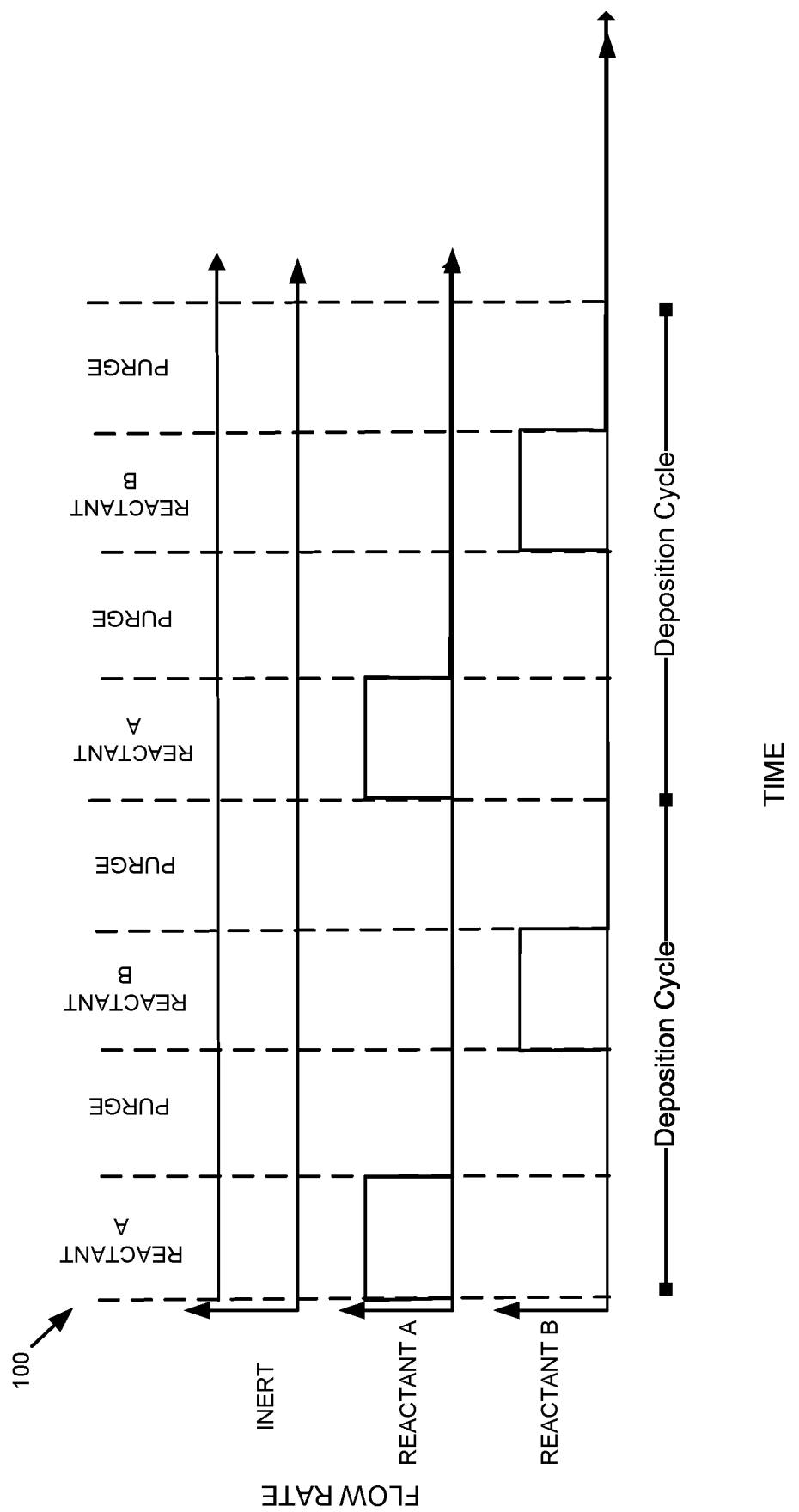

FIG. 7 shows an example of an alternating pulse sequence in which "reactant A" (which may the metal precursor or the reducing agent) and "reactant B" (the other of the metal precursor and the reducing agent) are pulsed alternately with purges between the pulses. Two deposition cycles are shown, each with a reactant A/purge/reactant B/purge sequence.

Of the examples of FIGS. 6 and 7, co-flowing the reactants is more similar to a CVD reaction, which results in a higher deposition rate and rougher nucleation layer. Thus, in some embodiments, the reactants may be co-flowed as in FIG. 6 for deposition of the first nucleation layer, with the alternating pulses used to deposit subsequent nucleation layers. The process sequences in FIG. 6 may be modified. For example, the metal precursor and reducing agent reactant pulses may be offset but overlap with a delay for one reactant with respect to the other. In another example, the inert gas may be pulsed for the purge phase.

c) Metal precursor and reducing agent flow duration: In embodiments in which an alternating reactant sequence is used (as in FIG. 7), the reactant dose durations may be such that the surface is supersaturated. In an ALD reaction, a deposition surface may be exposed to reactant A for a duration sufficient to saturate the surface with reactant A, forming a mono-layer. Shorter durations or longer durations can lead to undersaturated or supersaturated layers, respectively. Supersaturated layers have higher roughness. Thus, in some embodiments, the duration of the reactant pulses in FIG. 6 are longer for the first nucleation layer than for one or more subsequent nucleation layers. In one example, the duration may be at least 50% longer or at least 100% longer, i.e., twice as long. Amount of reactant dose can also be increased in addition to or instead of dose duration.

In some embodiments, the reducing agent dose can be increased for supersaturation. For example, a reducing agent dose may be increased at least 2-10 times or at 2-3 times the amount used for saturation. The metal precursor dose may stay the same or be increased up to 2-10 or 2-3 times the amount used for saturation. In the case of diborane, for example, diborane/metal precursor/diborane/metal precursor, etc. sequence can result in more boron occupying the sites available for metal precursor. This can result in a rougher film. Doses can be increased for other reducing agents such as silane and germane to increase roughness in this manner. In some embodiments, a nucleation layer is deposited using a reducing agent dose amount of at least ¼ liter. In the same or other embodiments, a nucleation layer is deposited using a reducing agent dose time of at least 10 seconds. In the same or other embodiments, a nucleation layer is deposited using a metal dose amount of at least 1/10 liter. In the same or other embodiments, a nucleation layer is deposited using a metal precursor dose time of at least 5 seconds.

d) Purge: In embodiments in which an alternating reactant sequence is used (as in FIG. 7), the ALD sequence may be purge phase may be controlled to be more CVD-like. This can be done by incomplete purge of the reactants. During a pure ALD reaction, reactant A is adsorbed onto the surface substrate and the subsequent purge removes any non-adsorbed reactant A. During the reactant B dose, reactant B reacts with the adsorbed reactant B to form the metal. The subsequent purge then removes any remaining reactant B for the next deposition cycle. Incomplete purging results in unreacted reactant remaining in the process chamber, available to react with the other reactant in the next dose. In this manner, the deposition has a CVD component with the metal depositing at a higher deposition rate and with higher roughness.

Incomplete purging can involve shortening the duration of each purge and/or using a purge in which an inert gas is flowed at a constant rate throughout the deposition. An example of flowing an inert gas throughout the deposition in shown in FIG. 7, To reduce or eliminate a CVD component, a purge that uses one or more accumulators (also referred to as charge volumes) may be used. These are discussed further below with respect to FIGS. 8A and 8B. In some embodiments, the purge uses a continuous flow during deposition of the first nucleation layer. The purge may be pulsed using an accumulator in a subsequent nucleation layer deposition. In some embodiments, a continuous flow may be diverted to provide pulsed flow into the chamber but without accumulation.

e) Pressure: Higher chamber pressure results in higher deposition rates and rougher nucleation layer. However, if the pressure is too high, the growth rate may be too high with the resulting film too thick. In some embodiments, pressure is between 1-90 Torr or 1-40 Torr, e.g., 10 Torr. In some embodiments, chamber pressure is higher during deposition of the first nucleation layer than during deposition of subsequent nucleation layers. Partial pressure of one or both of the reactant gases may be higher during deposition of the first nucleation layer than during deposition of subsequent nucleation layers.

f) Temperature: Higher substrate temperature can make the nucleation layer rougher. Example temperatures range from 100° C. to 300° C. In some embodiments, a subsequently deposited nucleation layer is deposited at a lower temperature than the first nucleation layer. In some embodiments, the first nucleation layer is deposited at a temperature of at least 200° C., or at least 250° C.

As indicated above, in some embodiments, the first nucleation layer is thicker than the combined thicknesses of the one or more subsequent nucleation layers. In some embodiments, it may be at least 50% thicker or about twice as thick (e.g., at least 90% thicker). The second and (if deposited) subsequent nucleation layer(s) are deposited at slower deposition rate with more control to obtain a desired total thickness. In one example, the total thickness of all nucleation layers may be about 2.5 nm. The first nucleation layer is deposited to a thickness of about 2 nm at a rate of 1 nm/cycle, followed by deposition of 0.5 nm of a second nucleation layer at a rate of 0.25 nm/cycle.

In embodiments in which multiple deposition cycles are used to deposit the first nucleation layer, the total number of cycles may be less than 5, e.g., 2-4 cycles for the first nucleation layer and 1-4, 1-3, or 1-2 total cycles for the subsequent nucleation layers.

Example Processes are Shown Below

TABLE 1

Example conditions for deposition of the first nucleation layer

| Process ID | A | B | C | D | E | F | G | H |
|---|---|---|---|---|---|---|---|---|
| Reducing agent | B2H6 | B2H6 | B2H6 | B2H6 | B2H6 | B2H6 | SiH4 | SiH4 |
| Co-flow (C) or alternating (A) pulses of metal precursor/reducing agent | A | A | A | A | A | C | C | A |
| Metal precursor/reducing agent pulse duration (seconds) | 4 s | 4 s | 4 s | 4 s | 4 s | n/a | n/a | 2 s |
| Purge—Continuous flow (CF) or Charge Volume (CV) | CF | CF | CV | CF | CF | CF | CF | CF |
| Pressure (torr) | 10 | 10 | 40 | 40 | 10 | 10 | 10 | 10 |
| Temperature (° C.) | 250 | 300 | 250 | 250 | 250 | 250 | 250 | 250 |

TABLE 2

Example conditions for deposition of the second and subsequent nucleation layers

| Process | I | J | K | L | M | N | O | P |
|---|---|---|---|---|---|---|---|---|
| Reducing agent | SiH4 | SiH4 | B2H6 | B2H6 | SiH4 | B2H6 | SiH4 | SiH4 |
| Co-flow (C) or alternating (A) pulses of metal precursor/reducing agent | A | A | A | A | A | A | A | A |
| Metal precursor/reducing agent pulse duration | 2 s | 2 s | 2 s | 2 s | 2 s | 2 s | 2 s | 2 s |
| Purge—Continuous flow (CF) or Charge Volume (CV) | CV | CF | CV | CF | CF | CF | CV | CV |
| Pressure (torr) | 10 | 10 | 10 | 10 | 10 | 10 | 10 | 10 |
| Temperature (° C.) | 250 | 250 | 250 | 250 | 200 | 200 | 100 | 150 |

In some embodiments, transitioning from deposition of the first nucleation layer to deposition of a subsequent nucleation layer includes changing the reducing agent. For example, changing from $B_2H_6$ to $SiH_4$ as is done by using process A for deposition of the first nucleation layer and process I for deposition of the second or other subsequent nucleation layer. Similarly, using any of processes A, B, C, D, E, or F for deposition of the first nucleation layer and any of processes I, J, M, O, and P for deposition of a subsequent nucleation layer involves changing from $B_2H_6$ to $SiH_4$.

In some embodiments, transitioning from deposition of the first nucleation layer to deposition of a subsequent nucleation layer includes using a metal precursor and reducing agent co-flow for the first nucleation layer and alternating flows for the subsequent nucleation layer. Examples include using either process F or G for deposition of the first nucleation layer and any of processes I, J, K, L, M, N, O, or P for deposition of a subsequent nucleation layer.

In some embodiments, transitioning from deposition of the first nucleation layer to deposition of a subsequent nucleation layer includes decreasing the metal precursor and/or reducing agent pulse duration. Examples include using any of processes A, B, C, D, or E for deposition of the first nucleation layer and any of processes I, J, K, L, M, N, O, or P for deposition of a subsequent nucleation layer.

In some embodiments, transitioning from deposition of the first nucleation layer to deposition of a subsequent nucleation layer includes changing from a continuous flow purge to a purge using a charge volume. Examples include using any of processes A, B, D, E, F, G, or H for deposition of the first nucleation layer and any of processes I, K, O, or P for deposition of a subsequent nucleation layer.

In some embodiments, transitioning from deposition of the first nucleation layer to deposition of a subsequent nucleation layer includes changing from lowering a chamber pressure. Examples include using either process C or D for deposition of the first nucleation layer and any of processes I, J, K, L, M, N, O, or P for deposition of a subsequent nucleation layer.

In some embodiments, transitioning from deposition of the first nucleation layer to deposition of a subsequent nucleation layer includes changing from lowering a substrate temperature. Examples include using process B for deposition of the first nucleation layer and any of processes I, J, K, L, M, N, O, or P for deposition of a subsequent nucleation layer and using any of processes A, C, D, E, F, G, or H for deposition of the first nucleation layer and any of processes M, N, O, or P for deposition of the subsequent nucleation layer.

In some embodiments, transitioning from the second to a third nucleation layer includes changing a reducing agent.

In some embodiments, a single rough nucleation layer may be deposited. For example, in some embodiments, between 2-5 cycles of a supersaturated process using long reducing agent dose times and/or high flowrates as described above may be used to deposit about 2-5 nm of a rough nucleation layer. A subsequent nucleation layer or bulk deposition may follow.

Table 1, below, shows results of increase in reducing agent dose time in reducing line bending of adjacent lines. Three processes were used to deposit a nucleation layer in adjacent lines followed by bulk deposition. Supersaturated conditions were used for processes B and C. The results show that LTL was decrease by increasing diborane dose time, and that this effect is not sensitive to chamber pressure during nucleation layer deposition.

| Process | Diborane dose time | Chamber pressure | LTL |
| --- | --- | --- | --- |
| A | 2-5 seconds | 40 | 4.5 |
| B | 10 seconds | 10 | 2.8 |
| C | 10 | 40 | 2.84 |

Measured roughness of the nucleation layer is increased for processes B and C as compared to process A, providing evidence that the increased roughness of the nucleation layer reduces line bending. Any one or more of the techniques described above may be used to deposit a nucleation layer with increased roughness. Subsequent bulk deposition conditions may not affect the line bending.

As discussed above, after the one or more nucleation layers have been deposited, the feature is filled with a bulk layer of the metal. Bulk deposition may involve simultaneous exposure or alternating introduction of two reactants. In CVD processes that both reactants are flowed at the same time during deposition. For example, bulk tungsten may be deposited by exposing a substrate to hydrogen ($H_2$) and tungsten hexafluoride ($WF_6$) at the same time for a duration sufficient to fill features. Hydrogen and $WF_6$ react during the exposure to deposit tungsten into the features. In pulsed CVD processes, one reactant is continuously flowed while the other reactant is pulsed, but the substrate is exposed to both reactants during deposition to deposit material during each pulse. For example, a substrate may be exposed to a continuous flow of $H_2$ while $WF_6$ is pulsed, and $WF_6$ and $H_2$ react during the pulse to deposit tungsten.

In some embodiments, bulk deposition may involve separate exposures to each reactant in an ALD process such that the reactants are not flowed into the chamber at the same time during deposition. Rather, each reactant flow is introduced to a chamber housing the substrate in temporally separated pulses in sequence, repeated one or more times in cycles.

While the above description chiefly describes tungsten layers, the methods may be implemented for feature fill using other metals including molybdenum, cobalt, and ruthenium.

Examples of Mo precursors for deposition of molybdenum materials include molybdenum halides such $MoF_6$ and $MoCl_6$, molybdenum oxyhalides such as molybdenum dichloride dioxide ($MoO_2Cl_2$) and molybdenum tetrachloride oxide ($MoOCl_4$), and molybdenum hexacarbonyl ($Mo(CO)_6$). Other Mo oxyhalides of the formula $Mo_xO_yHal_z$ where Hal is a halogen (fluorine (F), chlorine (Cl), bromine (Br), or iodine (I)) and x, y, and z are any number greater than zero that can form a stable molecule. These include molybdenum tetrafluoride oxide ($MoOF_4$), molybdenum dibromide dioxide ($MoO_2Br_2$), and molybdenum oxyiodides $MoO_2I$ and $Mo_4O_{11}I$. These precursors may be reacted with a reducing agent as described above.

In certain embodiments, organo-metallic precursors may also be used with examples including Mo precursors having cyclopentadienyl ligands. Further examples include precursors of the formula $Mo_2Ln$, wherein each L is independently selected from an amidate ligand, an amidinate ligand, and a guanidinate ligand, where n is 2-5. The $Mo_2Ln$ precursor includes a multiple molybdenum-molybdenum bond (such as a double bond or any multiple bond with a bond order of 2-5). Further examples include halide-containing heteroleptic molybdenum compounds (i.e., compounds having different types of ligands). Particular examples of such precursors are compounds that include molybdenum, at least one halide forming a bond with molybdenum, and at least one organic ligand having any of the N, O, and S elements, where an atom of any of these elements forms a bond with molybdenum. Examples of suitable organic ligands that provide nitrogen or oxygen bonding include amidinates, amidates, iminopyrrolidinates, diazadienes, beta-imino amides, alpha-imino alkoxides, beta-amino alkoxides, beta-diketiminates, beta-ketoiminates, beta-diketonates, amines, and pyrazolates. Examples of suitable organic ligands that provide sulfur bonding include thioethers, thiolates, dithiolenes, dithiolates, and α-imino thiolenes. These ligands may be substituted or unsubstituted. In some embodiments, these ligands include one or more substituents independently selected from the group consisting of H, alkyl, fluoroalkyl, alkylsilyl, alkylamino, and alkoxy substituents. The organic ligands can be neutral or anionic (e.g., monoanionic or dianionic), and molybdenum can be in a variety of oxidation states, such as +1, +2, +3, +4, +5, and +6.

To deposit ruthenium (Ru), Ru-precursors may be used. Examples of ruthenium precursors that may be used for oxidative reactions include (ethylbenzyl)(1-ethyl-1,4-cyclohexadienyl)Ru(0), (1-isopropyl-4-methylbenzyl)(1,3-cyclohexadienyl)Ru(0), 2,3-dimethyl-1,3-butadienyl)Ru(0)tricarbonyl, (1,3-cyclohexadienyl)Ru(0)tricarbonyl, and (cyclopentadienyl)(ethyl)Ru(II)dicarbonyl. Examples of ruthenium precursors that react with non-oxidizing reactants are bis(5-methyl-2,4-hexanediketonato)Ru(II)dicarbonyl and bis(ethylcyclopentadienyl)Ru(II).

To deposit cobalt (Co), cobalt-containing precursors including dicarbonyl cyclopentadienyl cobalt (I), cobalt carbonyl, various cobalt amidinate precursors, cobalt diazadienyl complexes, cobalt amidinate/guanidinate precursors, and combinations thereof may be used.

While $WF_6$ is used as an example of a tungsten-containing precursor, it should be understood that other tungsten-containing precursors may be suitable for performing disclosed embodiments. For example, a metal-organic tungsten-containing precursor may be used. Organo-metallic precursors and precursors that are free of fluorine, such as MDNOW (methylcyclopentadienyl-dicarbonylnitrosyl-tungsten) and EDNOW (ethylcyclopentadienyl-dicarbonylnitrosyl-tungsten) may also be used. Chlorine-containing tungsten precursors ($WCl_x$) such as tungsten pentachloride ($WCl_5$) and tungsten hexachloride ($WCl_6$) may be used.

The metal-containing precursor may be reacted with a reducing agent as described above. In some embodiments, $H_2$ is used as a reducing agent for bulk layer deposition to deposit high purity films.

In some embodiments, the bulk layer is performed at a reduced temperature. According to various embodiments, the reduced temperature (substrate temperature) is in one of the following ranges: between about 250-350° C., between about 250° C.-340° C., between about 250° C.-330° C., between about 250° C.-325° C., between about 250° C.-320° C., between about 250° C.-315° C., between about 250° C.-310° C., between about 250° C.-305° C., or between about 250° C.-300° C. Also according to various embodiments, the substrate temperature is: between about 260-310° C., between about 270° C.-310° C., between about 280° C.-310° C., or between about 290° C.-310° C. In certain embodiments, the process and/or substrate temperature is about 300° C. Reduced temperature CVD can be used to obtain high quality fill in narrow, high aspect ratio features. ALD may also be used.

Bulk deposition can further involve inhibition and/or etching operations to control fill profile. In any of the fill processes described herein, inhibition treatments may be preferentially applied to the top of the feature to facilitate fill improvement. Such inhibition treatments can involve thermal or plasma treatments using an inhibition chemistry. For example, an $N_2$ plasma or $NH_3$ thermal treatment can be used to inhibit nucleation at the top of a feature at any point during the fill process.

In some embodiments, nucleation inhibition is performed such that it extends to the bottom of the feature. This can be useful in disrupting metal-metal bonding, reducing or preventing the zipping mechanism described above.

An inhibition chemistry refers to an atom, compound, or other species that interacts with the surface to inhibit subsequent nucleation of the metal. Nitrogen can inhibit tungsten nucleation, for example, and can be delivered thermally (e.g., in ammonia) or in a plasma (e.g., $N_2$ plasma).

In some embodiments, the methods include a treatment to inhibit metal nucleation at least at sites along the sidewalls of the features. In some implementations, inhibition can involve a chemical reaction between inhibition species and the metal-containing precursor or feature surface to form small islands of a compound material such as tungsten nitride (WN) or tungsten carbide (WC). In some implementations, inhibition can involve a surface effect such as adsorption that passivates the surface without forming a layer of a compound material. The metal-containing precursor adsorb at sites that may provide seeds metal nucleation in subsequent deposition operations.

The inhibition chemistry may be a nitrogen-containing compound such as nitrogen ($N_2$), ammonia ($NH_3$), or hydrazine ($N_2H_2$). Other chemistries that may be used for inhibition of tungsten and other metal surfaces include oxygen-based and hydrocarbon-based chemistries. For example, molecular oxygen or methane may be introduced to a plasma generator. An inert component such as argon, xenon, or krypton may be used as a carrier gas. In some implementations, no other non-inert components are present in the gas from which the plasma is generated except in trace amounts. In some implementations, inhibition chemistries may be nitrogen-containing, hydrogen-containing, oxygen-containing, and/or carbon-containing, with one or more additional reactive species present in the plasma.

Etching may also be preferentially applied at the top of a feature. Example etch chemistries include halogen-containing compounds and species, e.g., nitrogen trifluoride ($NF_3$), fluorine gas ($F_2$), and atomic fluorine.

Figures 8A, 8B:
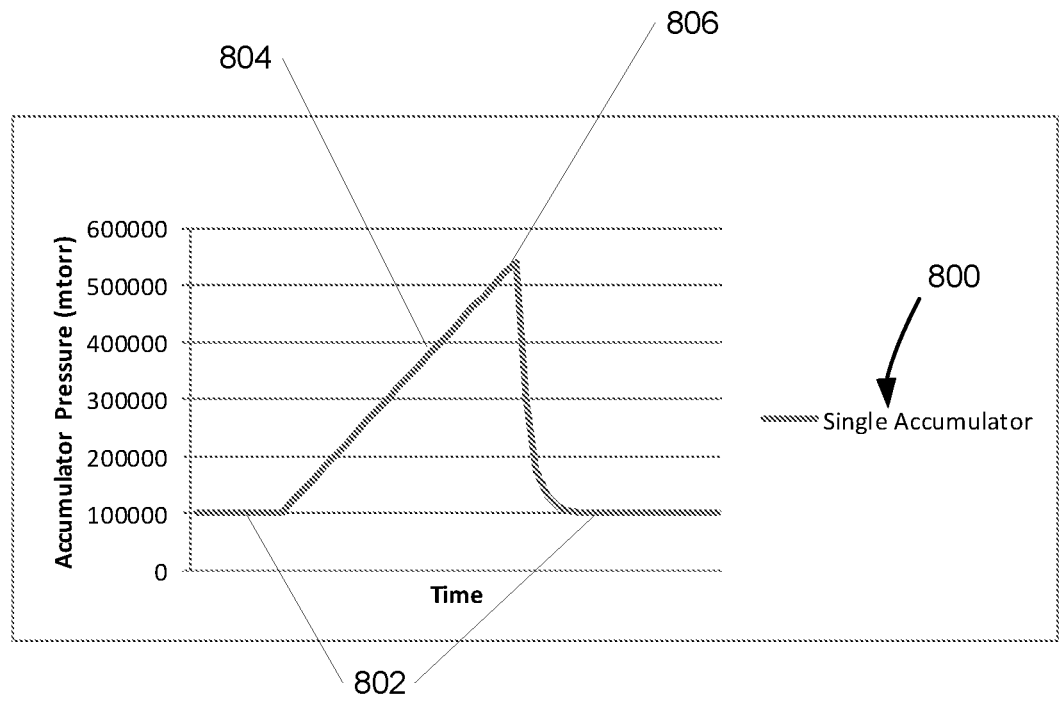
FIGS. 8A and 8B qualitatively represent example pressure of a volume in each of one or more accumulators as a function of time for two different ways of performing a purge operation according to various embodiments.

As indicated above, in some embodiments, a charge volume (also referred to as an accumulator) may be used for purging. In some embodiments, multiple accumulators may be used for rapid flush purging. FIGS. 8A and 8B represent the pressure of a volume in one or more accumulators as a function of time for two different ways of performing a purge operation. In FIG. 8A, an accumulator 800 is used to build a pressurized volume of purge gas, which is then flowed into the process chamber. Accumulator 800 has an initial pressure 802, which acts as a baseline pressure of the accumulator. Slope 804 shows the increase in pressure of the volume in the accumulator 800 as the purge gas is pressurized. In the example of FIG. 8A, the accumulator may reach a maximum pressure (e.g., about 550 Torr) before the purge gas is flowed to the chamber, but the pressure in the accumulator may vary from over a wider range (e.g., from about 400 Torr to about 1000 Torr). Then, at time 806 the purge gas is flowed into the chamber, and the pressure rapidly decreases as purge gas flows out of the accumulator 800. The decrease in pressure of the accumulator 800 corresponds with an increased flow of purge gas into the chamber. As the purge volume is flowed into the chamber, the pressure in the accumulator 800 returns to baseline value 802. The accumulator may then increase pressure and flow purge gas into the chamber for a second purge step (not shown).

FIG. 8B represents a rapid flush purge. A first accumulator 810 and a second accumulator 811 are used to flow purge gas into the chamber. Similar to FIG. 8A, both accumulators have a baseline pressure 812. Then, the first accumulator 810 is pressurized as shown by slope 814. At time 816 the purge gas from the first accumulator is flowed into the chamber, resulting in a rapid decrease in pressure in the first accumulator. The decrease in pressure of the accumulator corresponds with an increased mass flow of purge gas into the chamber. As the pressure in the first accumulator decreases, the mass flow of purge gas into the chamber will also decrease. Then, at time 817, the second accumulator 811 flows purge gas into the chamber. The second flow of pressurized purge gas again increases the mass flow of purge gas into the chamber. By using two accumulators, the average mass flow into the chamber is increased, increasing the rate of removal of reactant gases, and decreasing the total time required to purge the chamber. In some embodiments, additional accumulators may be used to continuously maintain a high-pressure flow of purge gas into the chamber. Purge gas can be flowed from any number of additional accumulators in a similar manner as the second accumulator. In some embodiments, each accumulator is pressurized and purge gas flowed into the chamber multiple times during a single rapid flush purge operation. For example, the first accumulator flowing purge gas into the chamber two or more times during a single purge operation. In some embodiments, additional accumulators or repeated flows from the same accumulators may be useful for large chambers, or where the volume of each accumulator is smaller than 300 cc. In various embodiments, the pressure may vary from about 400 Torr to about 1000 Torr. The pressure between the first and the second accumulator may also vary, where the first accumulator has a pressure between about 400 Torr and about 1000 Torr, and the second accumulator has a different pressure between about 400 Torr and about 1000 Torr.

The timing of flowing of purge gas from the first and second accumulator may vary across embodiments. In some embodiments, the second accumulator is flowed before the pressure of the first accumulator returns to baseline 812. In other embodiments, the second accumulator may be flowed as the first accumulator returns to the baseline pressure or after the first accumulator has returned to the baseline pressure. In some embodiments the second accumulator is simply flowed after the first accumulator, without regard to the pressure of the first accumulator. In some embodiments the second accumulator is flowed within 5 seconds, 3 seconds, 1 second, 0.5 seconds, or 0.1 seconds of flowing the first accumulator.

The flow of purge gas from an accumulator may be a choked flow. Choked flow may occur if the pressure ratio between a high pressure environment and a low pressure environment is great enough. The velocity of fluid flow will not increase with a further decrease in pressure of the low pressure environment, and the flow is considered choked. A threshold minimum pressure ratio for choked flow depends on the particular gases used, though generally is around 2:1. Choked flow can be modeled using only the conditions of the high pressure environment, including temperature, pressure, and gas density, which may be desirable when the parameters of the low pressure environment are unknown or changing. Specifically, when purging a process chamber, choked flow is relevant as a factor to reduce the time required to sufficiently purge the chamber.

During an ALD process, example chamber pressure ranges are about 3 Torr-100 Torr, about 3 Torr-40 Torr, or about 3 Torr-10 Torr. Meanwhile, the pressure of an accumulator for a purge step may be about 400 torr to 1000 torr. Thus, the initial flow of purge gas into the chamber from an accumulator is typically choked. However, as can be seen from FIG. 8B, the pressure in the accumulator will rapidly decay. The flow may become unchoked as the pressure ratio between the accumulator and the process chamber decreases. This would decrease the velocity and mass flow of purge gas into the chamber, increasing the time required to purge. By flowing purge gas from the second accumulator 811 as shown in FIG. 8B, the flow will remain choked, and the chamber will require less time to be purged. The timing of flowing purge gas from the second accumulator may vary among embodiments. In some embodiments, the purge gas from the second accumulator is flowed while the flow of purge gas into the chamber is choked. In other embodiments, the purge gas from the second accumulator may be flowed after the flow of purge gas into the chamber stops being choked. In such cases flowing purge gas from the second accumulator may cause the flow of purge gas into the chamber to become choked.

Apparatus

Any suitable chamber may be used to implement the disclosed embodiments. Example deposition apparatuses include various systems, e.g., ALTUS®, ALTUS® Max, ALTUS® LFW, and ALTUS® Max ICEFill, available from Lam Research Corp., of Fremont, California, or any of a variety of other commercially available processing systems. In some embodiments, a first nucleation layer may be deposited at a first station that is one of two, five, or even more deposition stations positioned within a single deposition chamber. Thus, for example, diborane ($B_2H_6$) and tungsten hexafluoride ($WF_6$) may be alternately introduced to the surface of the semiconductor substrate, at the first station, using an individual gas supply system that creates a localized atmosphere at the substrate surface to deposit a nucleation layer. The same or another station may be used for deposition of the second nucleation layer. That is, each of the nucleation layers may be deposited at its own individual station or two or more may be deposited at the same station. In embodiments in which the temperature is different for deposition of the first nucleation layer and a subsequent nucleation layer, for example, it can be advantageous to use two separate stations with individual temperature control. Another station may be used to deposit the bulk metal layer.

Two or more stations may be used to deposit metal in a parallel process. Alternatively, a wafer may be indexed to have deposition operations performed over two or more stations sequentially.

Figure 9:
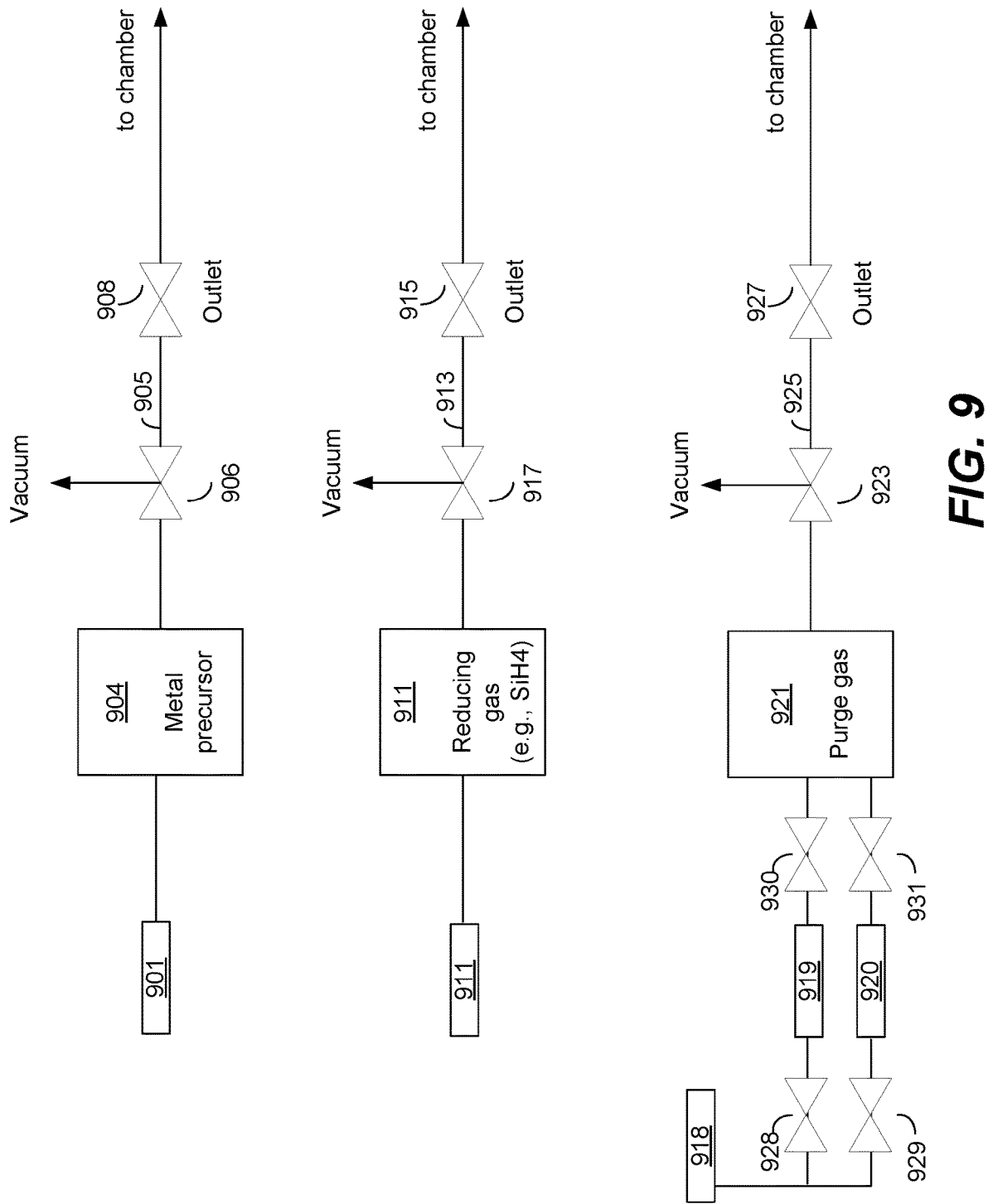
FIG. 9 shows a schematic of an example of a gas manifold system including accumulators according to various embodiments.

An apparatus may include a gas manifold system, which provides line charges to the various gas distribution lines as shown schematically in FIG. 9. Manifold 904 has inputs from a source 901 of a metal precursor gas, which may include an accumulator (not shown). Manifold 911 has an input 909 from a source of silane or other reducing gas (not shown), which may include an accumulator (not shown). There may or may not be an input from a carrier gas to manifold 911. Manifold 921 has an input from a first accumulator 919 and a second accumulator 920. The first accumulator 919 and the second accumulator 920 have inputs from a source of inert purge gas 918. The manifolds 904, 911 and 921 provide the metal-containing precursor gas, co-reactant gas, and purge gas to the deposition chamber through valved distribution lines 905, 913 and 925 respectively. The various valves may be opened or closed to provide a line charge, i.e., to pressurize the distribution lines. For example, to pressurize distribution line 905, valve 906 is closed to vacuum and valve 908 is closed. After a suitable increment of time, valve 908 is opened and the co-flow gas is delivered to the chamber. After a suitable time for delivery of the gas, valve 908 is closed. The chamber can then be purged to a vacuum by opening of valve 906 to vacuum.

Similar processes can be used to deliver the reducing gas. To introduce the reducing gas, for example, distribution line 913 is charged by closing valve 915 and closing valve 917 to vacuum. Opening of valve 915 allows for delivery of the reducing gas to the chamber.

Similarly, to introduce the purge gas, distribution line 925 is charged by closing valve 927 and closing valve 923 to vacuum. Opening of valve 927 allows for delivery of the argon or other inert purge gas to the chamber. Valves 928 and 930 may be opened or closed to introduce purge gas from the source of inert purge gas 918 to the accumulators 919 and 920. The amount of time allowed for line charges changes the amount and timing of the initial delivery of the gas. Valves 930 and 931 may be opened or closed to introduce purge gas from accumulators 919 and 920, respectively. Opening valve 930 and/or valve 931 changes the amount and timing of the delivery of purge gas as described above with respect to the various embodiments.

FIG. 9 also shows vacuum pumps in which valves 906, 917 and 923, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

Note that the processes described above may use precise timing of valves and mass flow controllers (MFCs) supplying pulses of gases to the semiconductor substrate during deposition. In one way to make this possible, valve and MFC commands are delivered to embedded digital input-output controllers (IOC) in discrete packets of information containing instructions for all time-critical commands for all or a part of a deposition sequence. The ALTUS systems of Lam Research provide at least one IOC sequence. The IOCs can be physically located at various points in the apparatus; e.g., within the process module or on a stand-alone power rack standing some distance away from the process module. There may be multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, ALD to run at station 1-2 with all timing controlled for all the hardware components needed to deposit an ALD nucleation layer at those stations. A second sequence might be running concurrently to deposit a bulk metal using the timing sequence described above at other deposition stations in the same module. The relative timing of the devices controlling the delivery of reagents to stations 3-4 is important within that group of devices, but the relative timing of the ALD process at stations 1-2 can be offset from the relative timing of stations 3-4. An IOC translates the information in a packetized sequence and delivers digital or analog command signals directly to MFC or pneumatic solenoid banks controlling the valves.

A pulse of metal-containing precursor gas may be generated as follows. Initially, the system diverts the gas to a vacuum pump for a period of time while the MFC or another flow-controlling device stabilizes. This may be done for a period of between about 0.5 to 5 seconds in one example. Next, the system pressurizes the tungsten gas delivery manifold by closing both the valve 906 to vacuum and the valve 908 to the deposition chamber. This may be done for a period of between about 0.1 and 5 seconds, for example, to create an initial burst of reagent when the valve to the deposition chamber is opened. This is accomplished by opening valve 908 for between about 0.1 and 10 seconds in one example.

Thereafter, the gas is purged from the deposition chamber using a suitable purge gas. Similar to above, the system may pressurize the purge gas delivery manifold by closing valve 923 and valve 927. Valve 930 and valve 931 are also closed to permit accumulators 919 and 920 to pressurize. This may be done for a period of between about 0.1 and 5 seconds, for example, to rapidly flush reagent from the deposition chamber when the valve to the deposition chamber is opened. When valve 927 is opened to the deposition chamber, valve 930 is opened simultaneously or shortly thereafter to increase the mass flow of purge gas into the deposition chamber. Valve 931 is then opened between about 0.1 and 5 seconds after valve 530 is opened to increase the mass flow of purge gas into the deposition chamber. The pulsed flow of other reagents may be done in a similar manner.

Figure 10:
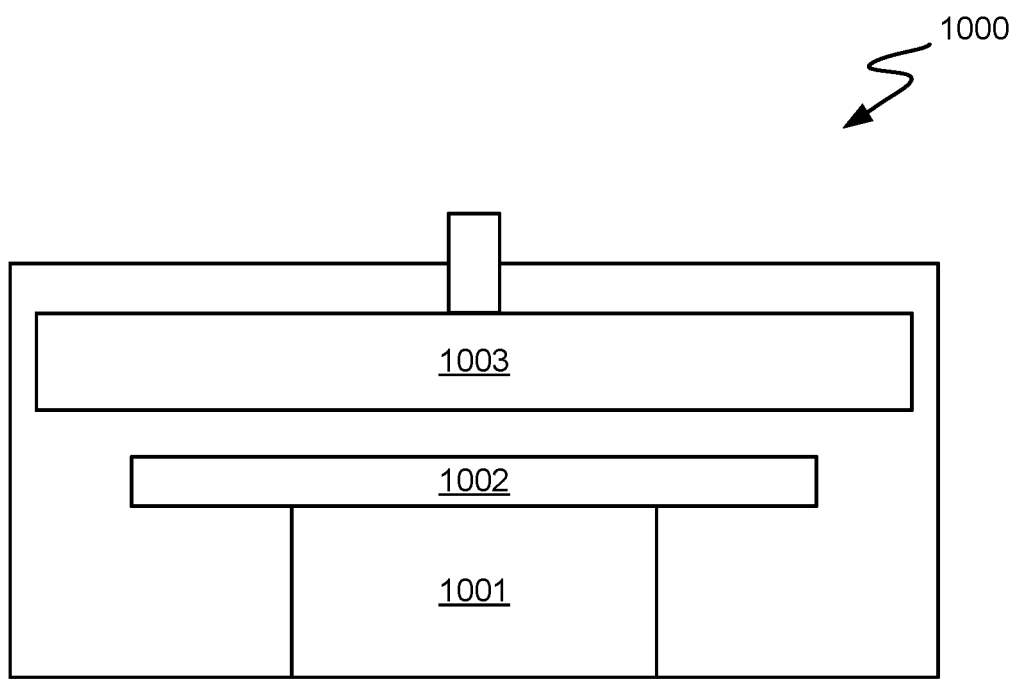
FIG. 10 shows a schematic example of a deposition station in a deposition chamber according to various embodiments.

A deposition station may include a heated pedestal or substrate support, one or more gas inlets or showerhead or dispersion plate. An example of a deposition station 1000 is depicted in FIG. 10, including substrate support 1002 and showerhead 1003. A heater may be provided in pedestal portion 1001.

Figure 11:
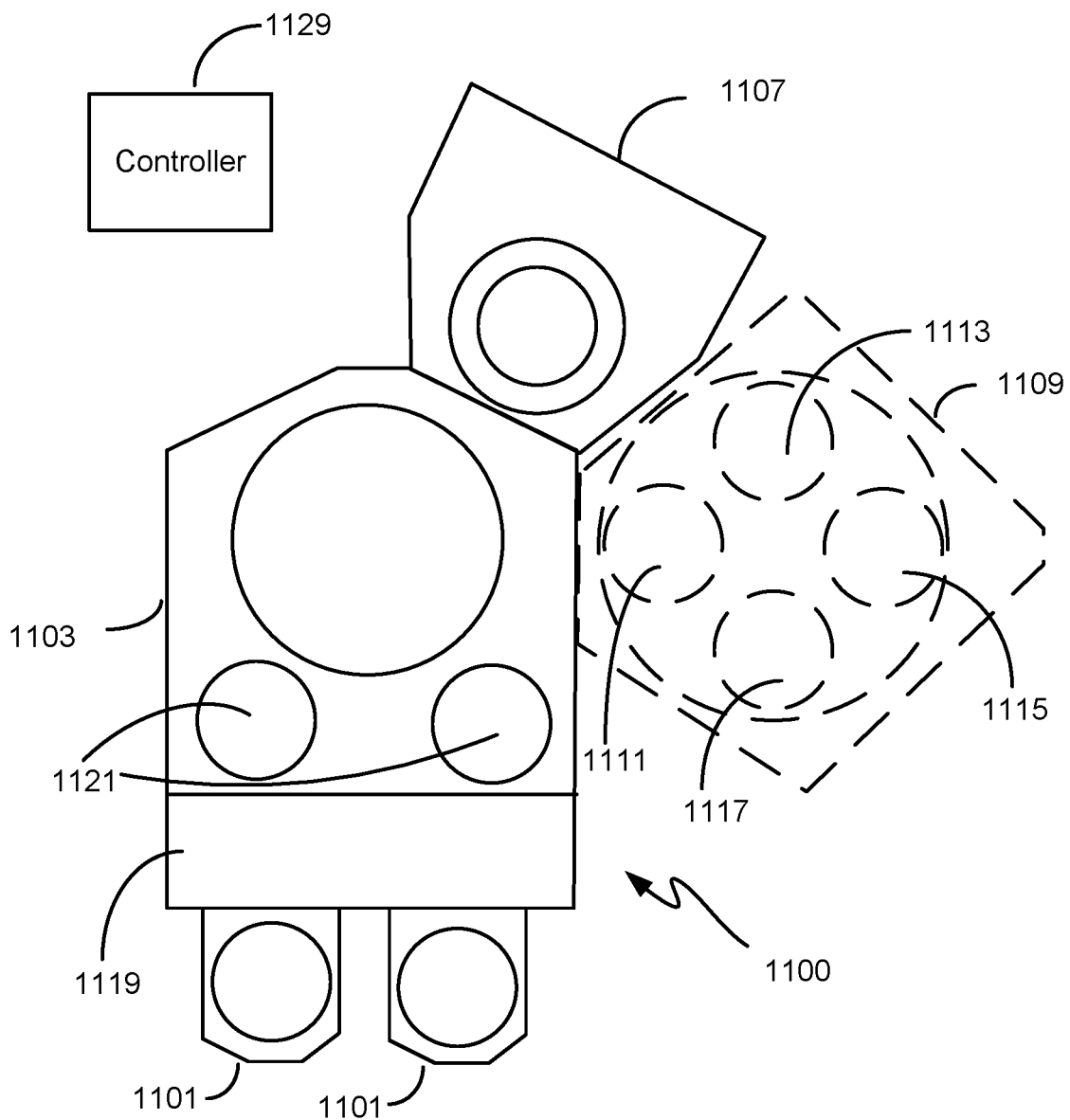
FIG. 11 is a diagram of a processing system suitable for conducting the deposition processes in accordance with embodiments.

FIG. 11 is a block diagram of a processing system suitable for conducting the deposition processes in accordance with embodiments. The system 1000 includes a transfer module 1003. The transfer module 1103 provides a clean, pressurized environment to minimize risk of contamination of substrates being processed as they are moved between various reactor modules. Mounted on the transfer module 1103 is a multi-station reactor 1109 capable of performing ALD and CVD with according to embodiments. Reactor 1109 may include multiple stations 1111, 1113, 1115, and 1117 that may sequentially perform operations in accordance with disclosed embodiments. For example, reactor 1109 could be configured such that station 1111 performs a first nucleation layer deposition by ALD, station 1113 performs a second nucleation layer deposition by ALD, and stations 1115 and 1117 perform bulk layer deposition by CVD or ALD.

In another example, reactor 1109 could be configured such that station 1111 performs first nucleation layer deposition by ALD or CVD, station 1113 performs a second nucleation layer deposition by ALD, station 1115 performs a third nucleation layer deposition by ALD, and station 1117 perform bulk layer deposition by CVD or ALD.

In another example, reactor 1109 could be configured such that station 1111 performs deposition of multiple nucleation layers and station 1113, 1115, and 1117 perform bulk layer deposition by CVD or ALD.

Also mounted on the transfer module 1103 may be one or more single or multi-station modules 1107 capable of performing plasma or chemical (non-plasma) pre-cleans. The module may also be used for various treatments to, for example, prepare a substrate for a deposition process. In some embodiments, a module 1107 may be used for a plasma inhibition treatment for example. Further, in some embodiments, any of the ALD processes or CVD processes described herein may be performed in a single station module such module 1107.

The system 1100 also includes one or more wafer source modules 1101, where wafers are stored before and after processing. An atmospheric robot (not shown) in the atmospheric transfer chamber 1119 may first remove wafers from the source modules 1101 to loadlocks 1121. A wafer transfer device (generally a robot arm unit) in the transfer module 1103 moves the wafers from loadlocks 1121 to and among the modules mounted on the transfer module 1103.

In various embodiments, a system controller 1129 is employed to control process conditions during deposition. The controller 1129 will typically include one or more memory devices and one or more processors. A processor may include a CPU or computer, analog and/or digital input/output connections, stepper motor controller boards, etc.

The controller 1129 may control all of the activities of the deposition apparatus. The system controller 1129 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 1129 may be employed in some embodiments.

Typically there will be a user interface associated with the controller 1129. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 1129. The signals for controlling the process are output on the analog and digital output connections of the deposition apparatus 1100.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 1129 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1229, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 1129, in some implementations, may be a part of or coupled to a computer that is integrated with, coupled to the system, otherwise networked to the system, or a combination thereof. For example, the controller 1129 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 1129 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Conclusion

Although the foregoing embodiments have been described in some detail for purposes of clarity of understanding, it will be apparent that certain changes and modifications may be practiced within the scope of the appended sample claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a substrate having a plurality of features spaced apart, each feature having a feature opening width, wherein the width of the feature narrows from the top of the feature to the bottom of the feature;
depositing a first conformal metal nucleation layer in the plurality of features; and
depositing a second conformal metal nucleation layer on the first conformal metal nucleation layer, wherein one or more of the following is different during deposition of the first conformal metal nucleation layer than during deposition of the second conformal metal nucleation layer: a) reducing agent chemistry, b) metal precursor and reducing agent flow sequence, c) metal precursor and reducing agent flow duration, d) purge conditions, e) chamber pressure, and f) substrate temperature.

2. The method of claim 1, wherein the width of the bottom of each feature is between 0 nm and 90% of the width at the top of the feature.

3. The method of claim 1, wherein the metal is selected from the group consisting of tungsten, ruthenium, molybdenum, and cobalt.

4. The method of claim 1, wherein the first conformal metal nucleation layer is thicker than the second conformal metal nucleation layer.

5. The method of claim 1, wherein diborane is the reducing agent during deposition of the first metal nucleation layer and not during deposition of the second metal nucleation layer.

6. The method of claim 1, wherein a metal precursor and a reducing agent are co-flowed during deposition of the first metal nucleation layer and wherein a metal precursor and a reducing agent are alternately pulsed during deposition of the second metal nucleation layer.

7. The method of claim 1, wherein a pulse duration of the metal precursor is longer during deposition of the first metal nucleation layer than during deposition of the second metal nucleation layer.

8. The method of claim 1, wherein a purge gas is continuously flowed during deposition of the first metal nucleation layer and pulsed during deposition of the second metal nucleation layer.

9. The method of claim 8, wherein pulsing the purge gas comprises using one or more purge gas accumulators.

10. The method of claim 1, wherein a chamber pressure housing the substrate is higher during deposition of the first metal nucleation layer than during deposition of the second metal nucleation layer.

11. The method of claim 1, wherein a substrate temperature is higher during deposition of the first metal nucleation layer than during deposition of the second metal nucleation layer.

12. The method of claim 1, wherein the features are spaced apart with a pitch of between about 10 nm and 60 nm between adjacent features.

13. The method of claim 1, further comprising depositing a third conformal metal nucleation layer on the second conformal metal nucleation layer.

14. The method of claim 1, wherein the first nucleation layer thickness is between about 1 nm to 2 nm.

15. The method of claim 1, wherein the second nucleation layer thickness is between about 0.5 nm to 1 nm.

16. A method comprising:
providing a substrate having a plurality of features spaced apart, each feature having a feature opening width, wherein the width of the feature narrows from the top of the feature to the bottom of the feature;
depositing a first conformal metal nucleation layer in the plurality of features under supersaturated conditions by exposing the feature to alternating doses of a reducing agent and a metal precursor, wherein each of the reducing agent doses is at least ¼ liter and at least 10 seconds in duration.

17. The method of claim 16, further comprising depositing a second conformal nucleation layer on the first conformal nucleation layer.

18. The method of claim 16, further comprising depositing bulk metal directly on the first conformal metal nucleation layer to fill the features with metal.

19. The method of claim 16, further comprising exposing the first conformal nucleation layer to a nitrogen-containing inhibition chemistry to inhibit nucleation in the plurality of features.

20. The method of claim 19, wherein nucleation is inhibited throughout the plurality of features including at the bottom of the features.

21. The method of claim 19, wherein nucleation is inhibited preferentially at the top of the features.

* * * * *